(12) United States Patent
Irie et al.

(10) Patent No.: US 8,263,307 B2
(45) Date of Patent: Sep. 11, 2012

(54) POSITIVE RESIST COMPOSITION AND METHOD OF FORMING RESIST PATTERN

(75) Inventors: Makiko Irie, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 282 days.

(21) Appl. No.: 12/427,547

(22) Filed: Apr. 21, 2009

(65) Prior Publication Data

US 2009/0269701 A1 Oct. 29, 2009

(30) Foreign Application Priority Data

Apr. 23, 2008 (JP) .................. 2008-112671

(51) Int. Cl.
*G03F 7/00* (2006.01)
*G03F 7/004* (2006.01)
(52) U.S. Cl. ................... 430/270.1; 430/322
(58) Field of Classification Search ............ 430/270.1, 430/322
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,927,009 B2 * | 8/2005 | Kodama et al. | 430/270.1 |
| 7,074,543 B2 | 7/2006 | Iwai et al. | |
| 7,618,764 B2 * | 11/2009 | Tanaka et al. | 430/270.1 |
| 7,625,690 B2 * | 12/2009 | Mizutani et al. | 430/270.1 |
| 2005/0142486 A1 * | 6/2005 | Chung et al. | 430/270.1 |
| 2005/0277060 A1 * | 12/2005 | Shirakawa et al. | 430/270.1 |
| 2008/0076062 A1 * | 3/2008 | Makino | 430/270.1 |
| 2008/0096134 A1 * | 4/2008 | Sugimoto et al. | 430/287.1 |
| 2008/0227031 A1 | 9/2008 | Cameron | |
| 2008/0227942 A1 * | 9/2008 | Benderly | 526/313 |
| 2009/0053649 A1 * | 2/2009 | Nakashima et al. | 430/285.1 |
| 2009/0061358 A1 | 3/2009 | Ohashi et al. | |
| 2011/0059400 A1 * | 3/2011 | Kamabuchi et al. | 430/287.1 |
| 2011/0294070 A1 * | 12/2011 | Hatakeyama et al. | 430/285.1 |

FOREIGN PATENT DOCUMENTS

| | | | |
|---|---|---|---|
| EP | 1319981 A2 * | 6/2003 | |
| EP | 2093213 A1 * | 8/2009 | |
| JP | H09-208554 | 8/1997 | |
| JP | H11-035551 | 2/1999 | |
| JP | H11-035552 | 2/1999 | |
| JP | H11-035573 | 2/1999 | |
| JP | H11-322707 | 11/1999 | |
| JP | 2002107920 A * | 4/2002 | |
| JP | 2003-241385 | 8/2003 | |
| JP | A-2006-111802 | 4/2006 | |
| JP | A-2008-197606 | 8/2008 | |
| JP | A-2008-287223 | 11/2008 | |
| JP | A-2009-080474 | 4/2009 | |
| WO | WO 2004-074242 | 9/2004 | |

OTHER PUBLICATIONS

Machine translation of JP 2002-107920 (no date).*
Office Action issued in counterpart Japanese Patent Application No. 2008-112671 on Jul. 24, 2012.

* cited by examiner

*Primary Examiner* — Amanda C. Walke
(74) *Attorney, Agent, or Firm* — Knobbe Martens Olson & Bear LLP

(57) ABSTRACT

A positive resist composition including a resin component (A) which exhibits increased solubility in an alkali developing solution under action of acid and an acid-generator component (B) which generates acid upon exposure, the resin component (A) including a structural unit (a0) represented by general formula (a0) (wherein R represents a hydrogen atom, a lower alkyl group of 1 to 5 carbon atoms or a halogenated lower alkyl group of 1 to 5 carbon atoms; Q represents a divalent linking group containing a nitrogen atom or an oxygen atom; $R^6$ represents a lower alkyl group of 1 to 5 carbon atoms or an alkoxy group of 1 to 5 carbon atoms; p represents an integer of 1 to 3; and q represents an integer of 0 to 2) and a structural unit (a1) derived from an acrylate ester containing an acid dissociable, dissolution inhibiting group exclusive of groups that exhibit aromaticity.

[Chemical Formula 1]

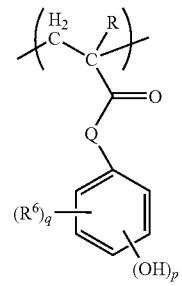

6 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition and a method of forming a resist pattern.

Priority is claimed on Japanese Patent Application No. 2008-112671, filed Apr. 23, 2008, the content of which is incorporated herein by reference.

2. Description of Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and j-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed solubility in an alkali developing solution under action of acid and an acid generator that generates acid upon exposure. For example, a chemically amplified positive resist contains, as a base resin, a resin which exhibits increased solubility in an alkali developing solution under action of acid, and an acid generator. In the formation of a resist pattern, when acid is generated from the acid generator upon exposure, the exposed portions become soluble in an alkali developing solution.

Until recently, polyhydroxystyrene (PHS) or derivative resins thereof in which the hydroxyl groups are protected with acid-dissociable, dissolution-inhibiting groups (PHS-based resins), which exhibit high transparency to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 nm.

As a result, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Japanese Unexamined Patent Application, First Publication No. 2003-241385).

Here, the term "(meth)acrylate ester" is a generic term that includes either or both of the acrylate ester having a hydrogen atom bonded to the opposition and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

SUMMARY OF THE INVENTION

In recent years, as the miniaturization of resist patterns progress, not only high resolutions, but also improvement in various lithography properties has been demanded.

For example, in electron beam (EB) or extreme ultraviolet (EUV) lithography, formation of an extremely fine pattern of several tens of nanometers is a goal. In conventional resist compositions, as the pattern size becomes smaller, further improvement in various lithography properties has been demanded.

Especially, improvement in exposure margin (EL margin) has been required for improving the process margin and the like in the formation of a resist pattern.

The EL margin is the range of the exposure dose in which a resist pattern can be formed with a size within a predetermined range of variation from a target size, when exposure is conducted by changing the exposure dose, i.e., the range of the exposure dose in which a resist pattern faithful to the mask pattern can be formed. The larger the exposure margin, the smaller the variation in the pattern size depending on the change in the exposure dose, thereby resulting in favorable improvement in the process margin.

However, in conventional resist compositions, control of the pattern size depending on the exposure dose was unsatisfactory.

The present invention takes the above circumstances into consideration, with an object of providing a positive resist composition and a method of forming a resist pattern, which exhibit small variation in the resist pattern size when the exposure dose is changed (i.e., exhibit a large EL margin).

As a result of diligent studies of the present inventors, they have found that the aforementioned problems can be solved by using a resin component including two specific structural units as the base resin. The present invention has been completed based on this finding.

Specifically, a first aspect of the present invention is a positive resist composition including a resin component (A) which exhibits increased solubility in an alkali developing solution under action of acid and an acid-generator component (B) which generates acid upon exposure, the resin component (A) including a structural unit (a0) represented by general formula (a0) shown below and a structural unit (a1) derived from an acrylate ester containing an acid dissociable, dissolution inhibiting group exclusive of groups that exhibit aromaticity.

[Chemical Formula 1]

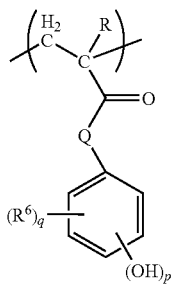

(a0)

In formula (a0), R represents a hydrogen atom, a lower alkyl group of 1 to 5 carbon atoms or a halogenated lower alkyl group of 1 to 5 carbon atoms; Q represents a divalent linking group containing a nitrogen atom or an oxygen atom; $R^6$ represents a lower alkyl group of 1 to 5 carbon atoms or an alkoxy group of 1 to 5 carbon atoms; p represents an integer of 1 to 3; and q represents an integer of 0 to 2.

A second aspect of the present invention is a method of forming a resist pattern, including: applying a positive resist composition of the first aspect to a substrate to form a resist film on the substrate; conducting exposure of the resist film; and alkali-developing the resist film to form a resist pattern.

In the present description and claims, the term "alkyl group" includes linear, branched or cyclic, monovalent saturated hydrocarbon group, unless otherwise specified.

The term "alkylene group" includes linear, branched or cyclic divalent saturated hydrocarbon group, unless otherwise specified.

A "lower alkyl group" is an alkyl group of 1 to 5 carbon atoms.

A "halogenated alkyl group" is a group in which a part or all of the hydrogen atoms of an alkyl group is substituted with halogen atoms. Examples of halogen atoms include fluorine atoms, chlorine atoms, bromine atoms and iodine atoms.

The term "structural unit" refers to a monomer unit that contributes to the formation of a polymeric compound (polymer, copolymer).

The term "exposure" is used as a general concept that includes irradiation with any form of radiation.

According to the present invention, there are provided a positive resist composition and a method of forming a resist pattern, which exhibit small variation in the resist pattern size when the exposure dose is changed (i.e., exhibit a large EL margin).

DETAILED DESCRIPTION OF THE INVENTION

<<Positive Resist Composition>>

The positive resist composition of the present invention includes a resin component (A) (hereafter, frequently referred to as "component (A)") which exhibits increased solubility in an alkali developing solution under action of acid and an acid-generator component (B) which generates acid upon exposure (hereafter, referred to as "component (B)").

In the positive resist composition of the present invention, the component (A) is insoluble in an alkali developing solution prior to exposure, and when acid is generated from the component (B) upon exposure, acid dissociable, dissolution inhibiting groups are dissociated and the solubility of the entire component (A) in an alkali developing solution increases, and hence, the component (A) changes from alkali insoluble to alkali soluble. Therefore, in the formation of a resist pattern, by conducting selective exposure of a resist film formed using the positive resist composition, the exposed portions become alkali soluble, whereas the unexposed portions remain alkali insoluble, and hence, a resist pattern can be formed by alkali developing.

<Component (A)>

In the present invention, the component (A) includes a structural unit (a0) represented by general formula (a0) and a structural unit (a1) derived from an acrylate ester containing an acid dissociable, dissolution inhibiting group exclusive of groups that exhibit aromaticity.

It is preferable that the component (A) includes a structural unit (a2) derived from an acrylate ester containing a lactone-containing cyclic group, as well as the structural units (a0) and (a1).

Further, it is preferable that the component (A) includes a structural unit (a3) derived from an acrylate ester containing a polar group-containing aliphatic hydrocarbon group, as well as the structural units (a0) and (a1), or the structural units (a0), (a1) and (a2).

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

The term "alkyl group" includes linear, branched or cyclic, monovalent saturated hydrocarbon, unless otherwise specified.

A "lower alkyl group" is an alkyl group of 1 to 5 carbon atoms.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

Structural Unit (a0)

The structural unit (a0) is represented by general formula (a0).

By using the component (A) including the structural unit (a0) and the structural unit (a1) described later, it becomes possible to produce a positive resist composition which exhibit small variation in the resist pattern size when the exposure dose is changed (i.e., exhibit a large EL margin).

Further, by virtue of including the structural unit (a0), the component (A) exhibits increased solubility in an alkali developing solution.

In general formula (a0), R represents a hydrogen atom, a lower alkyl group of 1 to 5 carbon atoms or a halogenated lower alkyl group of 1 to 5 carbon atoms.

The lower alkyl group or halogenated lower alkyl group for R is as defined for the lower alkyl group or halogenated lower alkyl group which may be bonded to the α-position of the aforementioned acrylate ester.

R is preferably a hydrogen atom or a lower alkyl group, and a hydrogen atom or a methyl group is particularly desirable.

In general formula (a0), Q represents a divalent linking group containing a nitrogen atom or an oxygen atom.

Q may contain an atom other than a nitrogen atom and an oxygen atom. Examples of atoms other than a nitrogen atom and an oxygen atom include a carbon atom, a hydrogen atom and a sulfur atom.

Examples of Q include —NH—, —NR$^{01}$— (in the formula, R$^{01}$ represents a lower alkyl group of 1 to 5 carbon atoms), —NH—R$^{02}$— (in the formula, R$^{02}$ represents an alkylene group of 1 to 5 carbon atoms which may have a substituent), —NR$^{01}$—R$^{02}$—; —O—, —O—R$^{02}$—, —O—R$^{02}$—O—C(O)—; —NH—C(O)—NH— and —O—R$^{02}$—NH—C(O)—NH—.

Among these examples, it is particularly desirable that Q represent —O— or —NH—, as the variation in the resist pattern size when the exposure dose is changed becomes small (i.e., the EL margin becomes large).

The lower alkyl group of 1 to 5 carbon atoms for R$^{01}$ is as defined above for the lower alkyl group for R.

With respect to R$^{02}$, the alkylene group "has a substituent" means that a part or all of the hydrogen atoms within the alkylene group has been substituted with an atom or group other than a hydrogen atom. Examples of substituents which the alkylene group may have include an alkyl group of 1 to 4 carbon atoms, an alkoxy group of 1 to 4 carbon atoms, and a hydroxyl group.

The alkylene group for R$^{02}$ is preferably a linear or branched alkylene group. The alkylene group preferably has 1 to 5 carbon atoms, and most preferably 1 to 3.

Specific examples of the alkylene group include a methylene group [—CH$_2$—]; alkylmethylene groups such as —CH(CH$_3$)—, —CH(CH$_2$CH$_3$)—, —C(CH$_3$)$_2$—; —C(CH$_3$)(CH$_2$CH$_3$)—, —C(CH$_3$)(CH$_2$CH$_2$CH$_3$)— and —C(CH$_2$CH$_3$)$_2$; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; altyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

In general formula (a0), p represents an integer of 1 to 3, and preferably 1.

The bonding position of the hydroxyl group may be either the o-position, m-position or p-position of the phenyl group.

When p is 1, the bonding position of the hydroxyl group is preferably the p-position, in terms of availability at a low cost.

When p is 2 or 3, a desired combination of the bonding positions can be used.

In general formula (a0), q represents an integer of 0 to 2, preferably 0 or 1, and most preferably 0 from industrial viewpoint.

In general formula (a0), R$^6$ represents a lower alkyl group of 1 to 5 carbon atoms or an alkoxy group of 1 to 5 carbon atoms.

Examples of the lower alkyl group for R$^6$ include the same lower alkyl groups as those described above for R.

The alkyl group within the alkoxy group for R$^6$ is the same as the lower alkyl group for R$^6$.

Specific examples of the structural unit (a0) represented by general formula (a0) are shown below.

[Chemical Formula 2]

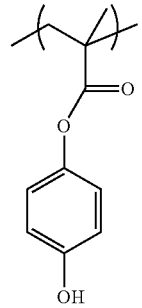

(a01-1)

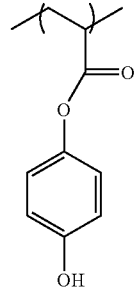

(a01-2)

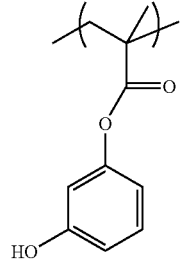

(a01-3)

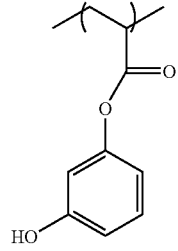

(a01-4)

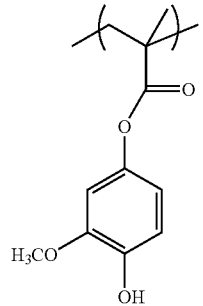

(a01-5)

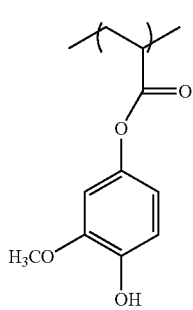 (a01-6)
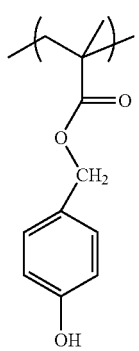 (a01-7)
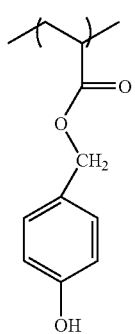 (a01-8)
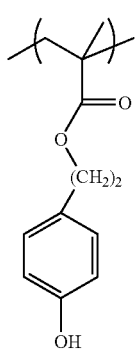 (a01-9)
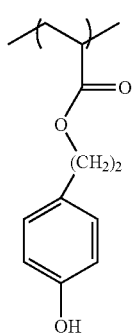 (a01-10)
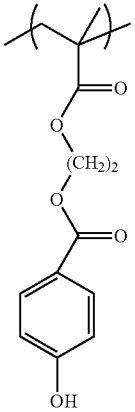 (a01-11)
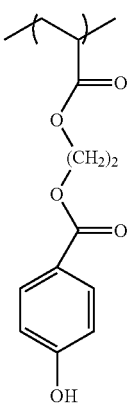 (a01-12)
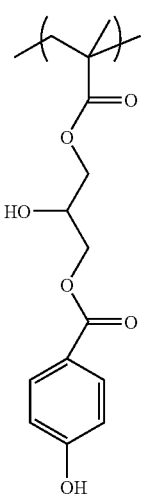 (a01-13)

(a01-14)
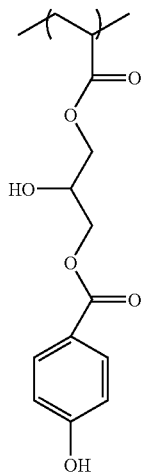
(a01-15)
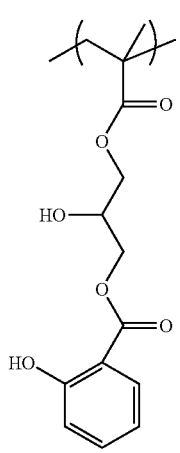
(a01-16)
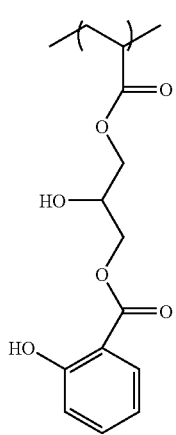
[Chemical Formula 3]
(a02-1)
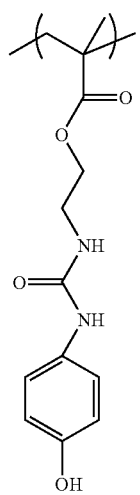
(a02-2)
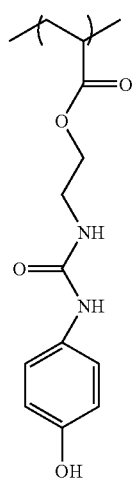
(a02-3)
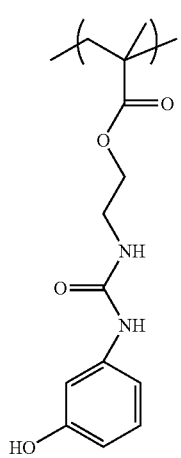

(a02-4)

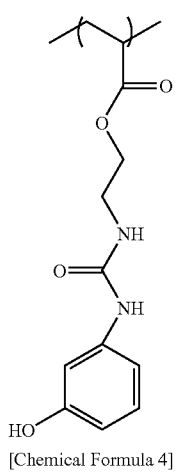

[Chemical Formula 4]

(a03-1)

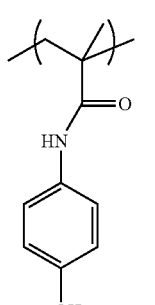

(a03-2)

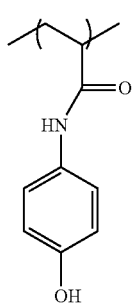

(a03-3)

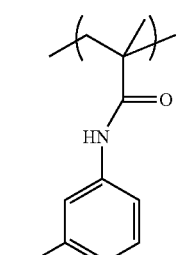

(a03-4)

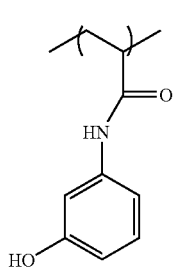

(a03-5)

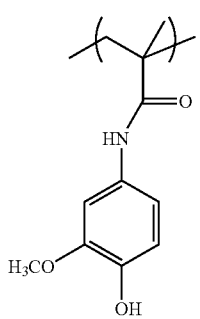

(a03-6)

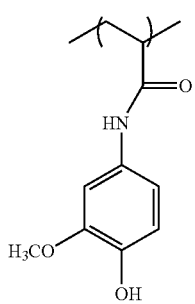

[Chemical Formula 5]

(a04-1)

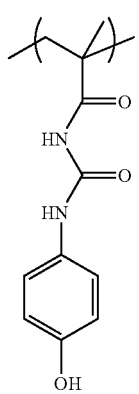

(a04-2)

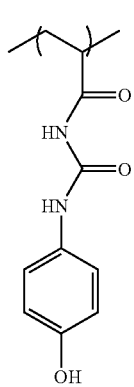

As the structural unit (a0), one type of structural unit may be used alone, or two or more types of structural units may be used in combination.

Among the examples shown above, it is preferable to use at least one structural unit selected from the group consisting of structural units represented by formulas (a01-1) to (a01-4), (a01-7) to (a01-10) and (a03-1) to (a03-4), and more preferably at least one structural unit selected from the group consisting of structural units represented by formulas (a01-1), (a01-2), (a03-1) and (a03-2).

In the component (A), the amount of the structural unit (a0) based on the combined total of all structural units constituting the component (A) is preferably 1 to 50 mol %, more preferably 3 to 40 mol %, and still more preferably 5 to 35 mol %. By ensuring that the amount of the structural unit (a0) is at least as large as the lower limit of the above-mentioned range, the exposure margin (EL margin) is improved, and a resist pattern having an excellent shape can be formed. On the other hand, by ensuring that the amount of the structural unit (a0) is no more than the upper limit of the above-mentioned range, a good balance can be achieved with the other structural units.

Structural Unit (a1)

The structural unit (a1) is a structural unit derived from an acrylate ester containing an acid dissociable, dissolution inhibiting group exclusive of groups that exhibit aromaticity.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A) insoluble in an alkali developing solution prior to dissociation, and then following dissociation by action of acid, increases the solubility of the entire component (A) in the alkali developing solution.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known.

However, the acid dissociable, dissolution inhibiting group for the structural unit (a1) does not include groups that exhibit aromaticity.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic" is a relative concept used in relation to the term "aromatic", and defines a group or compound that has no aromaticity.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, lower alkoxy groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" may be either a monocyclic group or a polycyclic group, and is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclodecanyl group, and a branched alkylene group having a tertiary carbon atom bonded thereto, as the groups bonded to the oxygen atom of the carbonyl group (—C(O)—O—) within the structural units represented by general formulas (a1"-1) to (a1"-6) shown below, can be used.

[Chemical Formula 6]

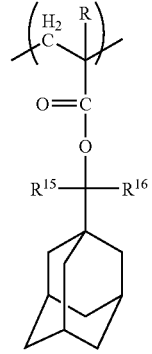

(a1"-1)

-continued (a1″-2)
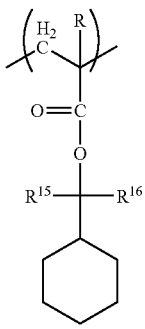

(a1″-3)
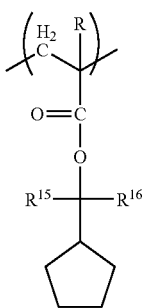

(a1″-4)
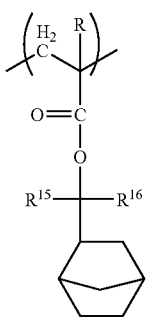

(a1″-5)
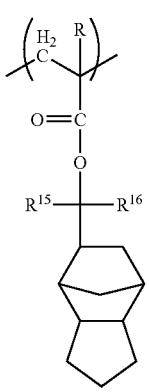

-continued (a1″-6)
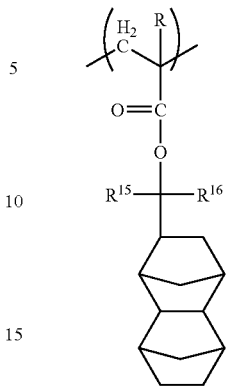

In the formulas above, R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1″-1) to (a1″-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 7]

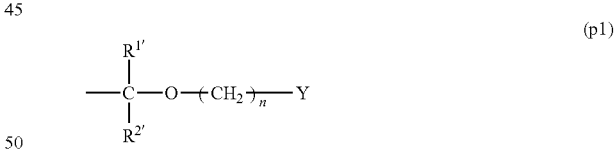

(p1)

In the formula above, $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same lower alkyl groups as those for R above can be used. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 8]

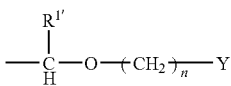
(p1-1)

wherein $R^{1\prime}$, n and Y are as defined above.

As the lower alkyl group for Y, the same lower alkyl groups as those for R above can be used.

As the aliphatic cyclic group for Y, any of the aliphatic monocyclic/polycyclic groups which have been proposed for conventional ArF resists and the like can be appropriately selected for use. For example, the same groups as those described above in connection with the "aliphatic cyclic group" can be used.

Further, as the acetal-type, acid dissociable, dissolution inhibiting group, groups represented by general formula (p2) shown below can also be shown.

[Chemical Formula 9]

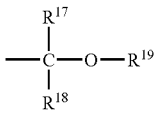
(p2)

In the formula above, $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of cycloalkyl groups include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 10]

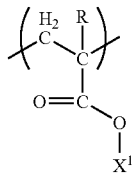
(a1-0-1)

In the formula above, R represents a hydrogen atom, a lower alkyl group or a halogenated lower alkyl group; and $X^1$ represents an acid dissociable, dissolution inhibiting group.

[Chemical Formula 11]

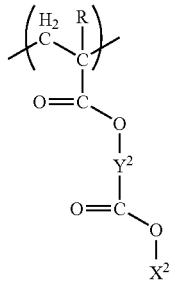
(a1-0-2)

In the formula above, R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.

In general formula (a1-0-1) shown above, lower alkyl group and halogenated lower alkyl group for R are the same as the lower alkyl group and halogenated Lower alkyl group which can be bonded to the position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as $X^1$ in general formula (a1-0-1).

$Y^2$ is preferably an alkylene group of 1 to 10 carbon atoms or a divalent aliphatic cyclic group. As the aliphatic cyclic group, the same groups as those described above in connection with the explanation of "aliphatic cyclic group" can be used, except that two hydrogen atoms have been removed therefrom.

When $Y^2$ represents an alkylene group of 1 to 10 carbon atoms, it is more preferable that the number of carbons is 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

Specific examples of the structural unit (a1) include structural units represented by general formulas (a1-1) to (a1-4) shown below.

[Chemical Formula 12]

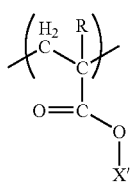

(a1-1)

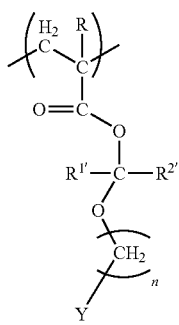

(a1-2)

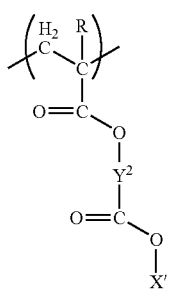

(a1-3)

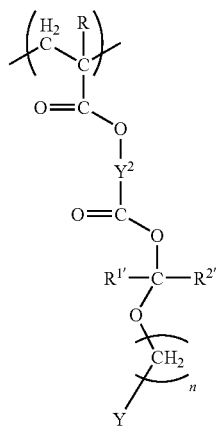

(a1-4)

In the formulas above, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R is as defined above; and $R^{1\prime}$ and $R^{2\prime}$ each independently represents a hydrogen atom or a lower alkyl group of 1 to 5 carbon atoms.

Examples of the tertiary alkyl ester-type acid dissociable, dissolution inhibiting group for X' are the same as the above-mentioned tertiary alkyl ester-type acid dissociable, dissolution inhibiting groups for $X^1$.

As $R^{1\prime}$, $R^{2\prime}$, n and Y, the same groups as those for $R^{1\prime}$, $R^{2\prime}$, n and Y defined in general formula (p1) described above in connection with the "acetal-type acid dissociable, dissolution inhibiting group" may be used.

As $Y^2$, the same groups as those for $Y^2$ defined in general formula (a1-0-2) above may be used.

Specific examples of structural units represented by general formula (a1-1) to (a1-4) are shown below.

[Chemical Formula 13]

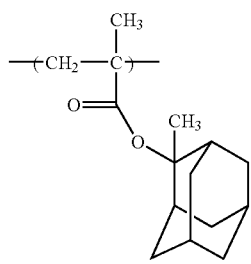

(a1-1-1)

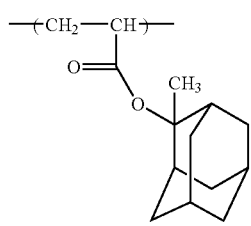

(a1-1-2)

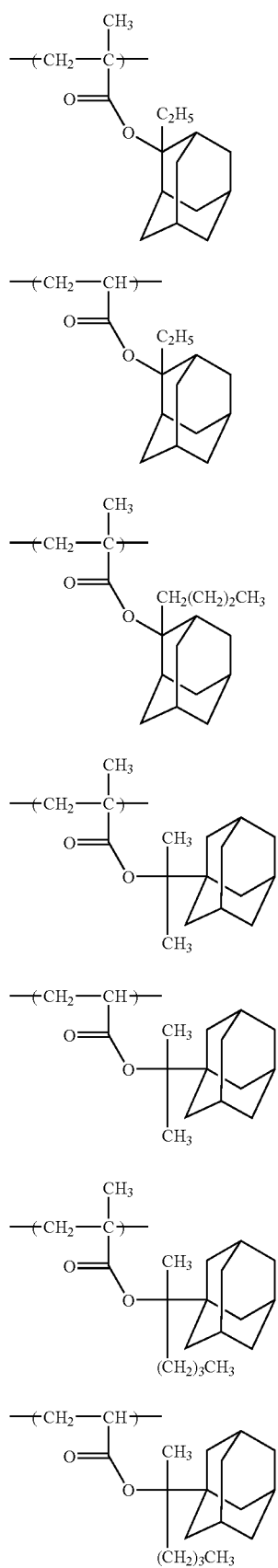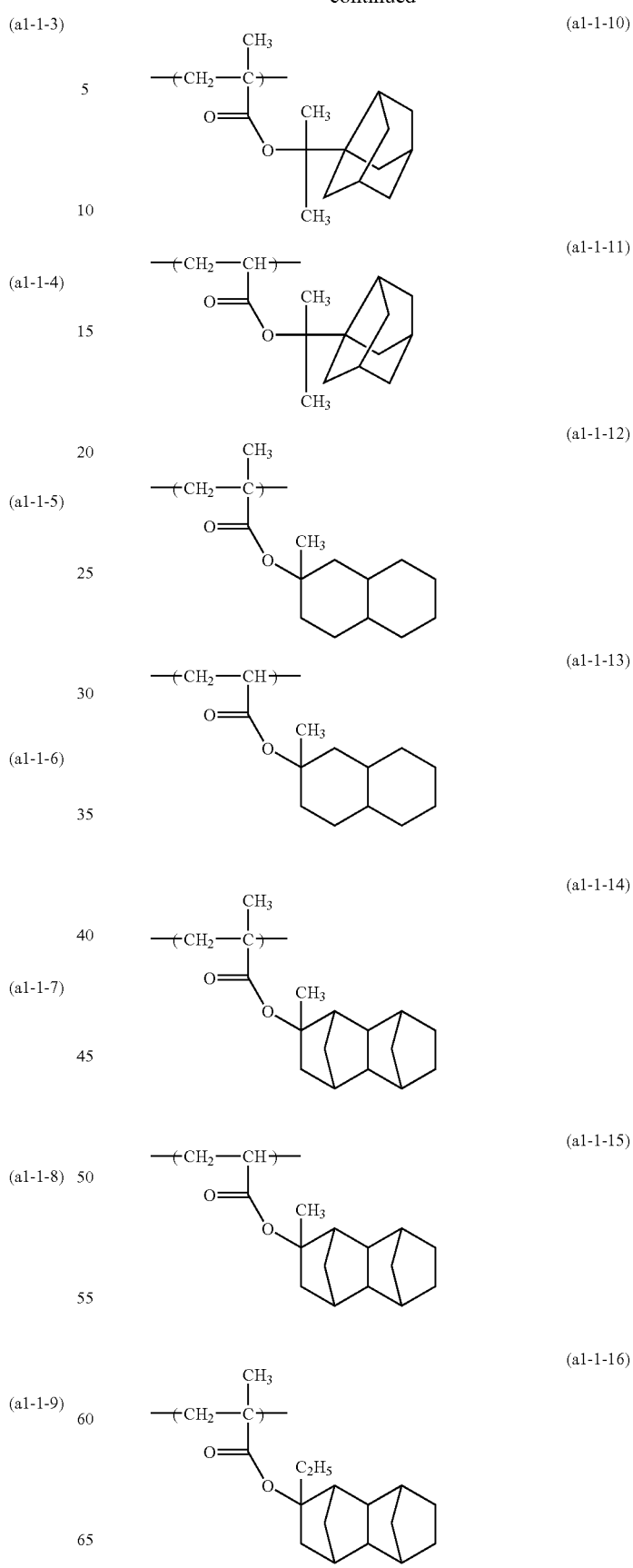

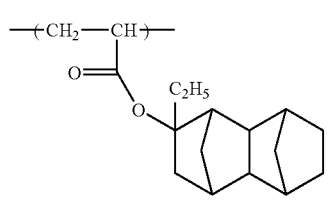
(a1-1-17)
[Chemical Formula 14]
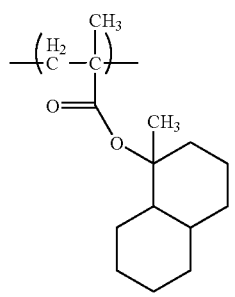
(a1-1-18)
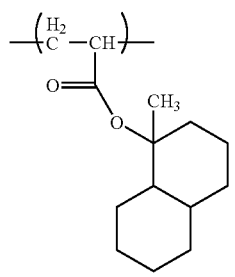
(a1-1-19)
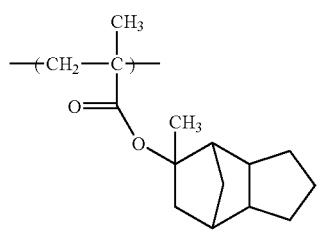
(a1-1-20)
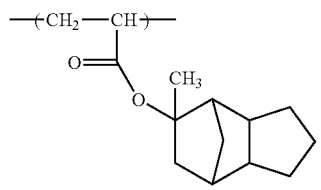
(a1-1-21)
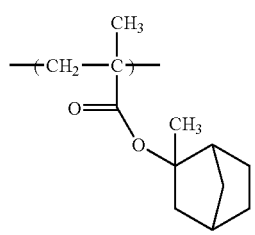
(a1-1-22)
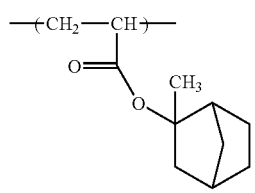
(a1-1-23)
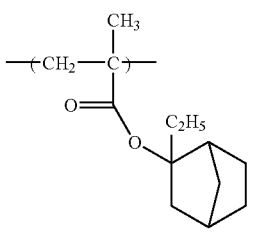
(a1-1-24)
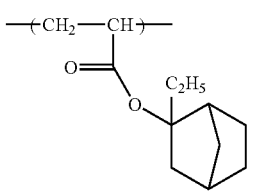
(a1-1-25)
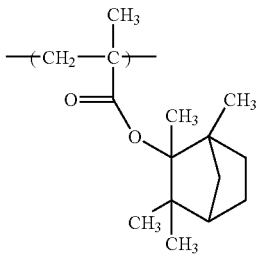
(a1-1-26)
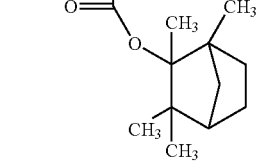
(a1-1-27)
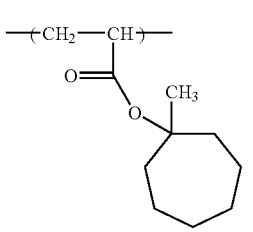
(a1-1-28)
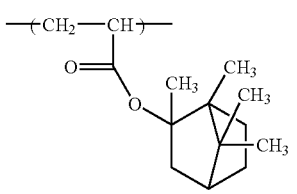
(a1-1-29)
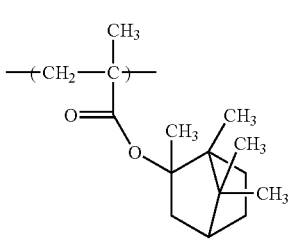
(a1-1-30)

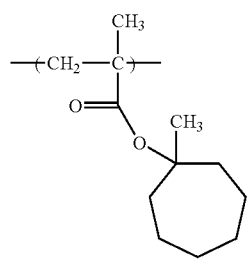 (a1-1-31)
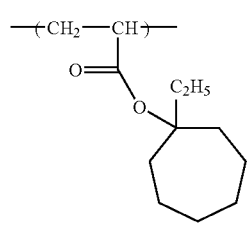 (a1-1-32)
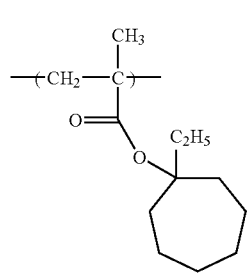 (a1-1-33)
[Chemical Formula 15]
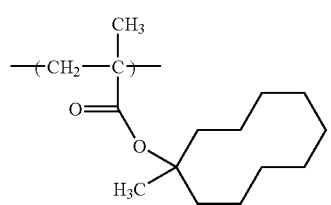 (a1-1-34)
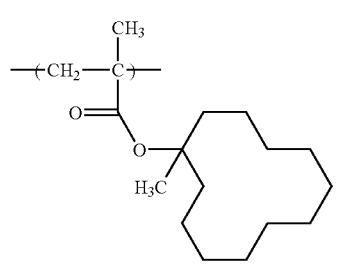 (a1-1-35)
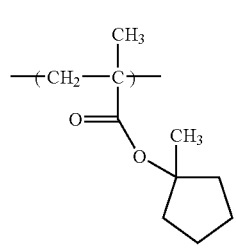 (a1-1-36)
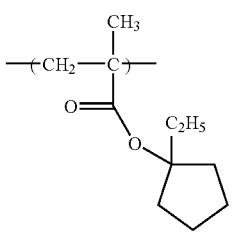 (a1-1-37)
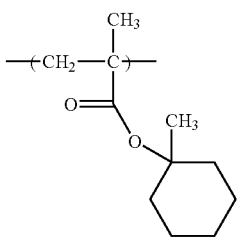 (a1-1-38)
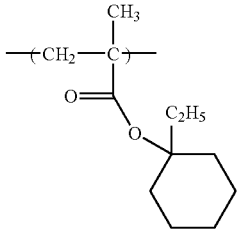 (a1-1-39)
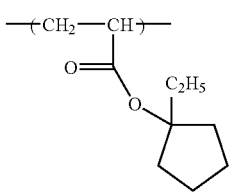 (a1-1-40)
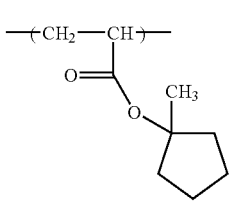 (a1-1-41)
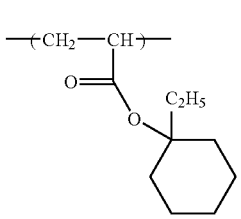 (a1-1-42)
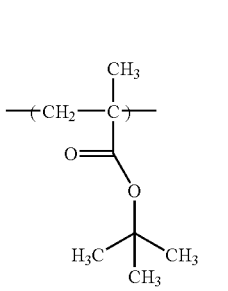 (a1-1-43)

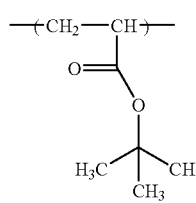 (a1-1-44)
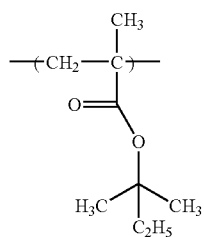 (a1-1-45)
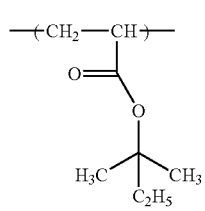 (a1-1-46)
[Chemical Formula 16]
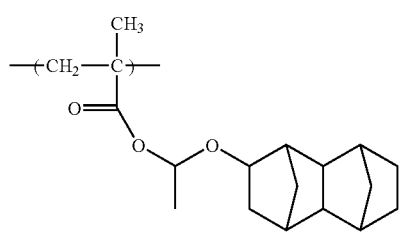 (a1-2-1)
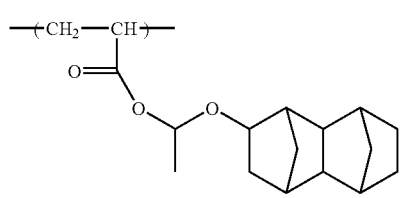 (a1-2-2)
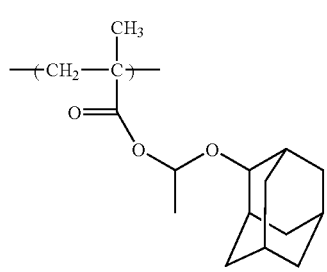 (a1-2-3)
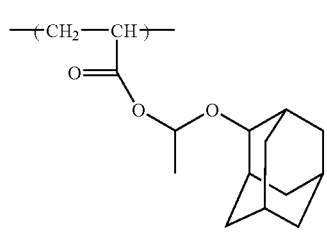 (a1-2-4)
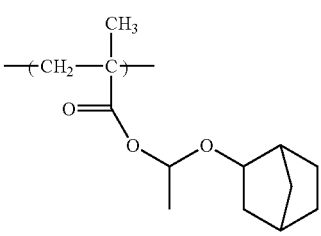 (a1-2-5)
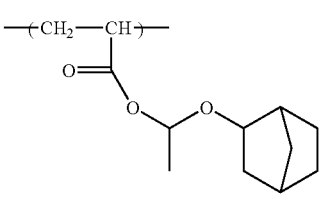 (a1-2-6)
[Chemical Formula 17]
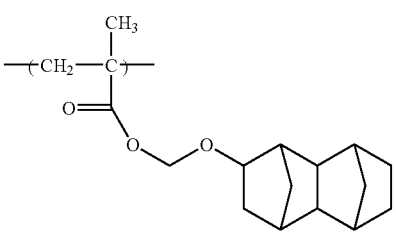 (a1-2-7)
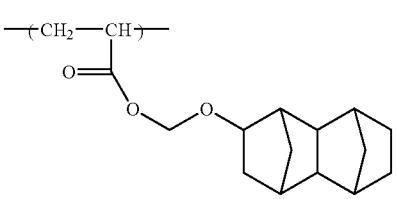 (a1-2-8)
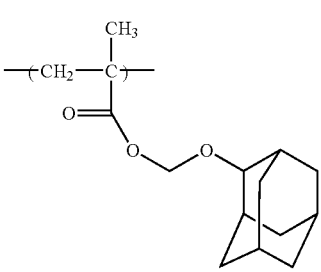 (a1-2-9)
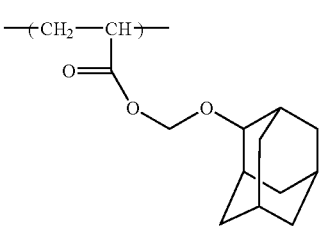 (a1-2-10)
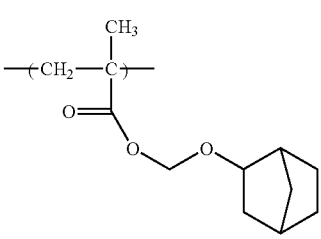 (a1-2-11)

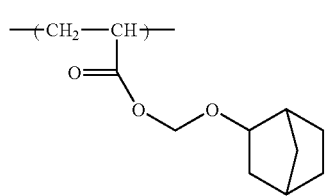
(a1-2-12)
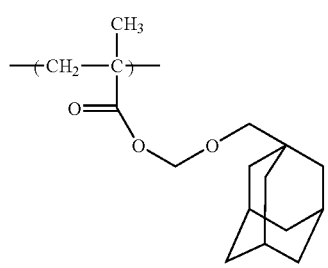
(a1-2-13)
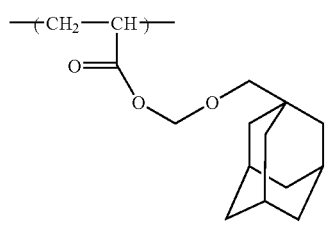
(a1-2-14)
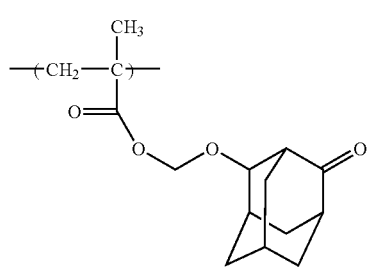
(a1-2-15)
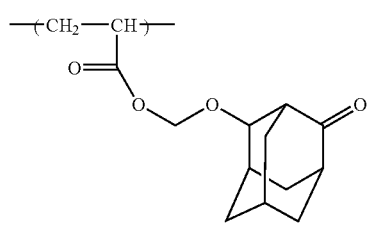
(a1-2-16)
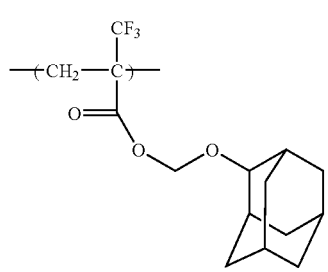
(a1-2-17)
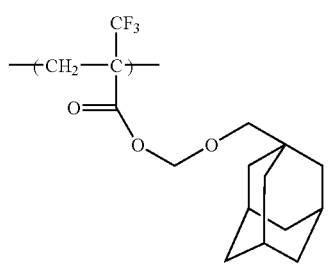
(a1-2-18)
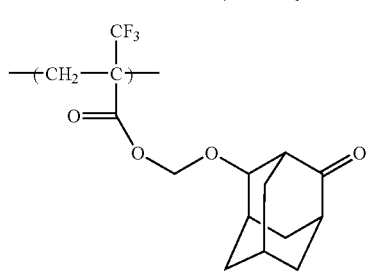
(a1-2-19)
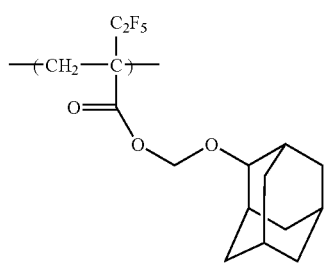
(a1-2-20)
[Chemical Formula 18]
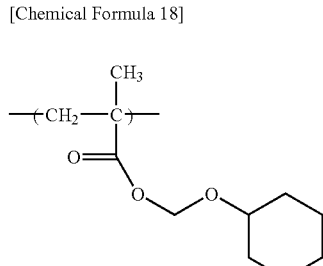
(a1-2-21)
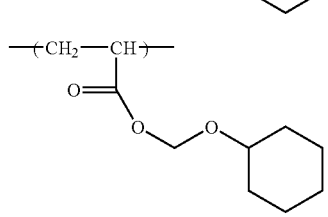
(a1-2-22)
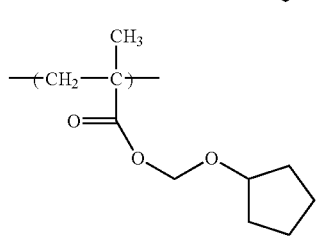
(a1-2-23)
(a1-2-24)

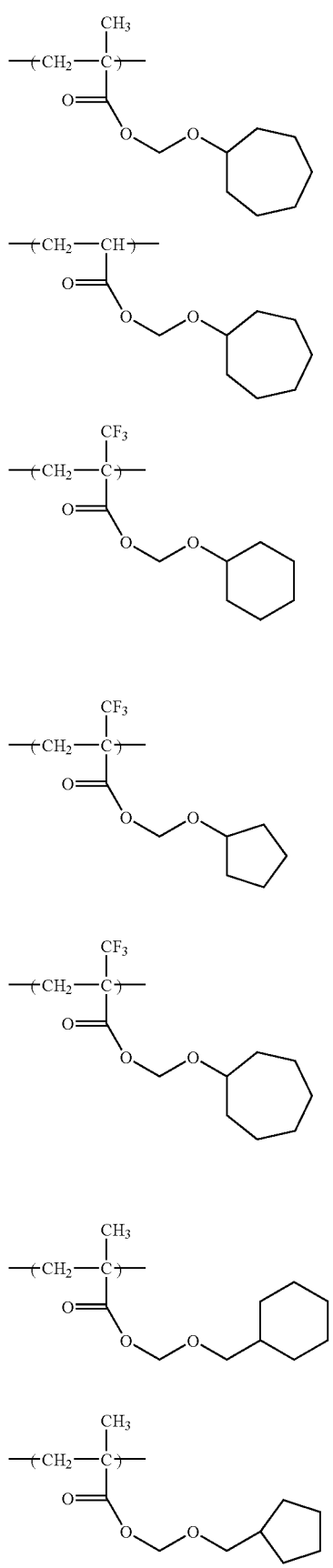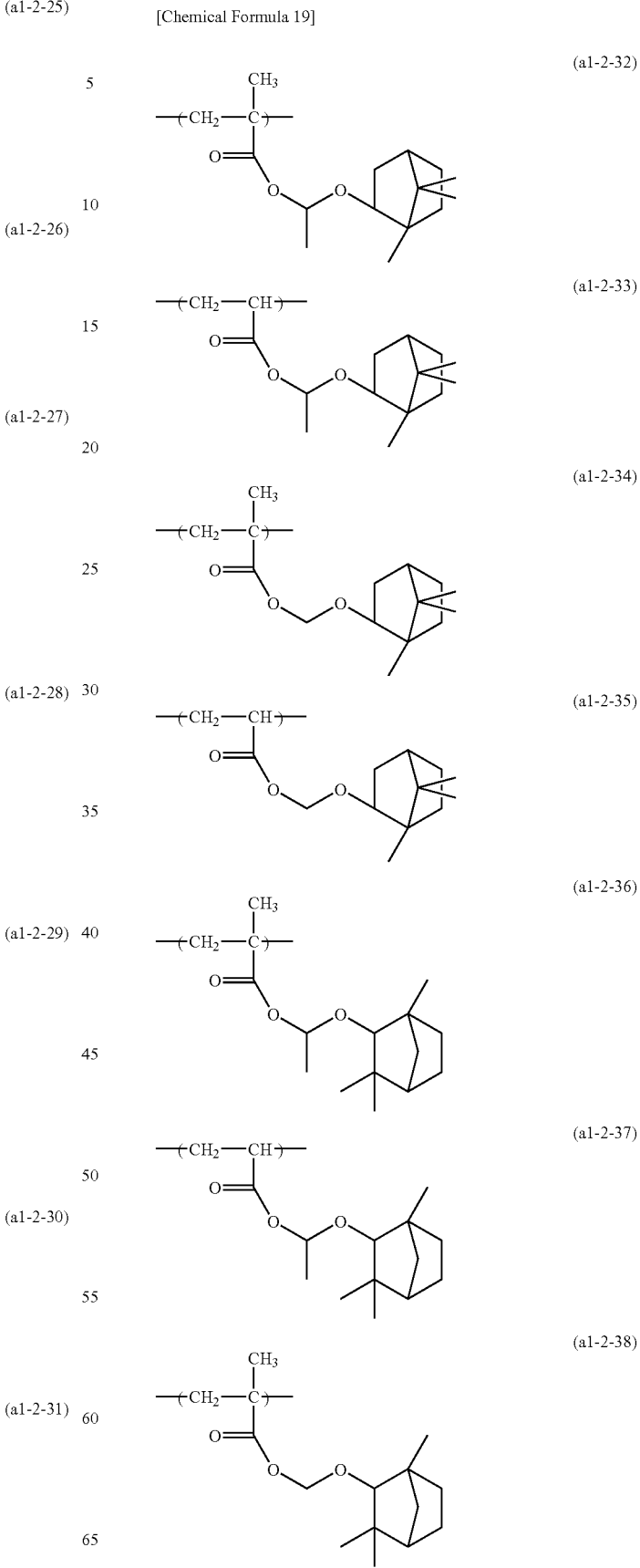

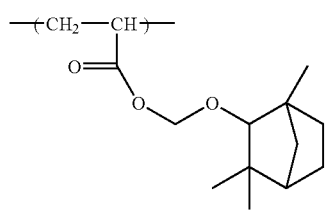
(a1-2-39)
[Chemical Formula 20]
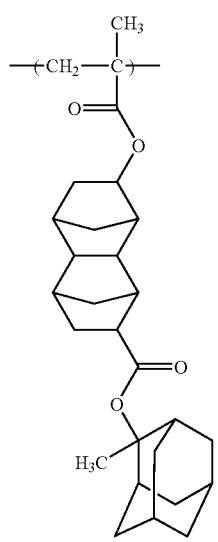
(a1-3-1)
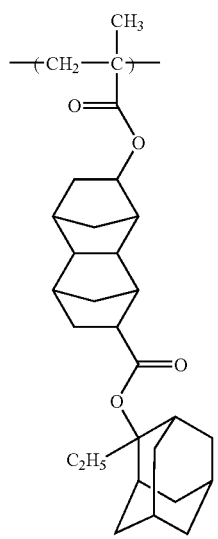
(a1-3-2)
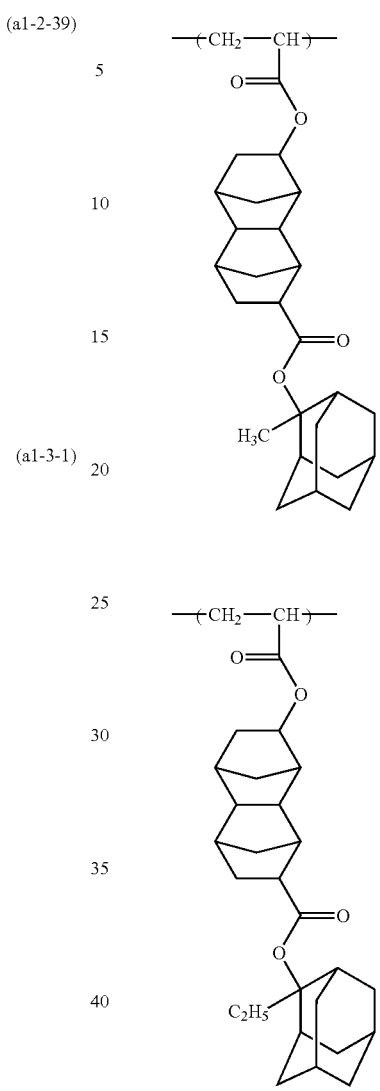
(a1-3-3)
(a1-3-4)
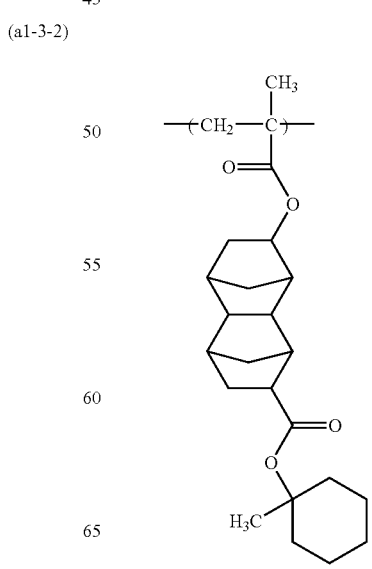
(a1-3-5)

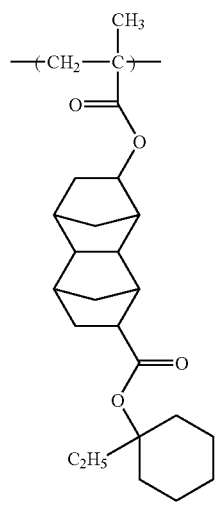 (a1-3-6)
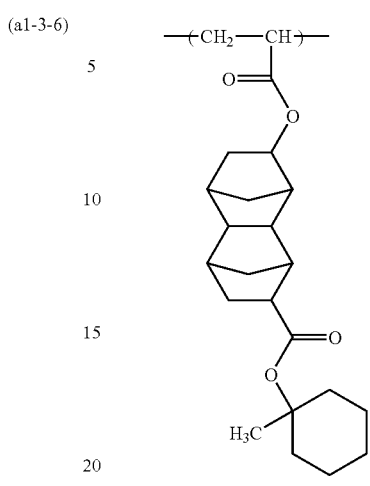 (a1-3-9)
(a1-3-7)
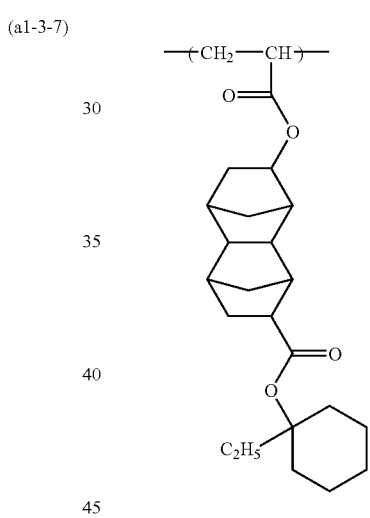 (a1-3-10)
(a1-3-8)
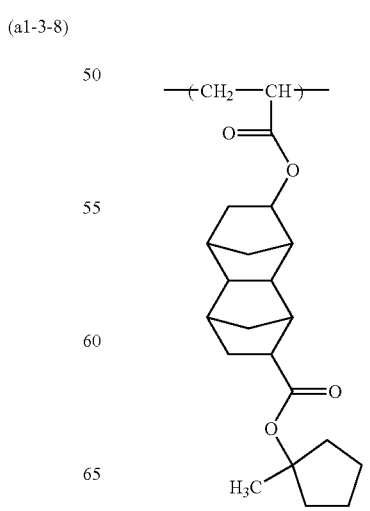 (a1-3-11)

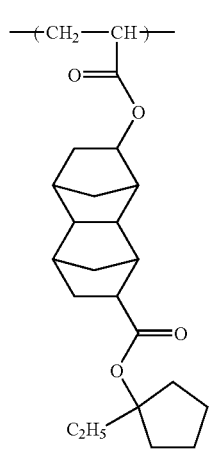 (a1-3-12)
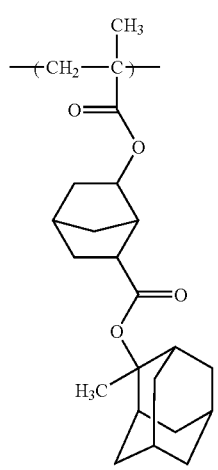 (a1-3-13)
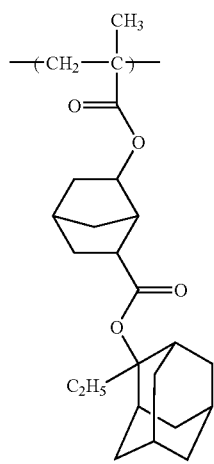 (a1-3-14)
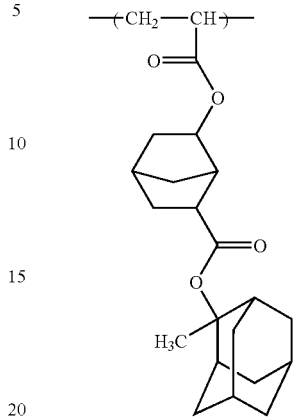 (a1-3-15)
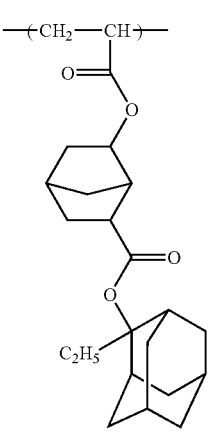 (a1-3-16)
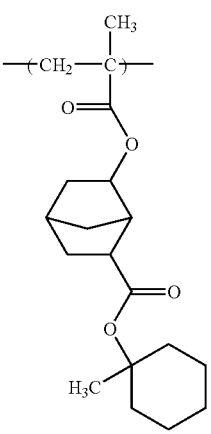 (a1-3-17)

[Chemical Formula 21]
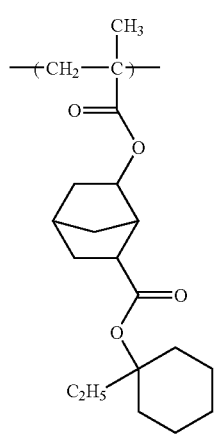 (a1-3-18)
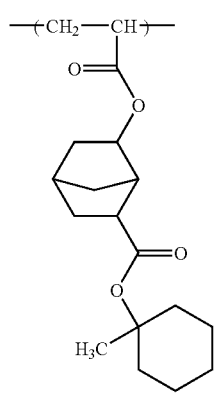 (a1-3-19)
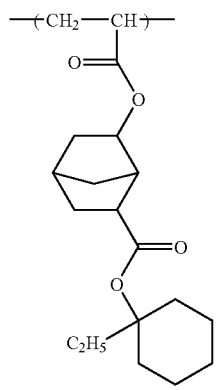 (a1-3-20)
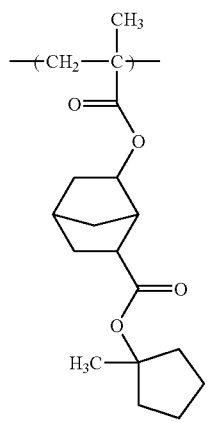 (a1-3-21)
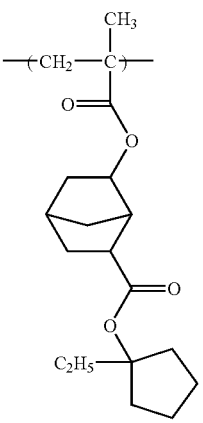 (a1-3-22)
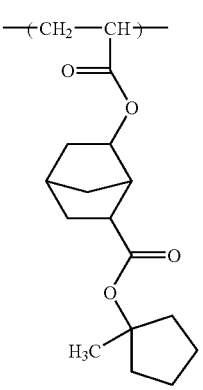 (a1-3-23)
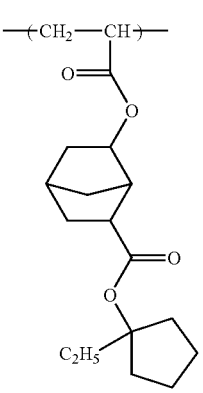 (a1-3-24)
[Chemical Formula 22]
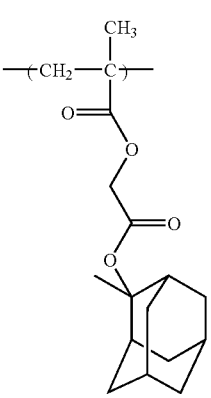 (a1-3-25)

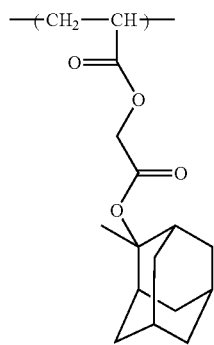 (a1-3-26)
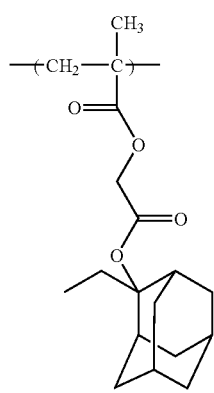 (a1-3-27)
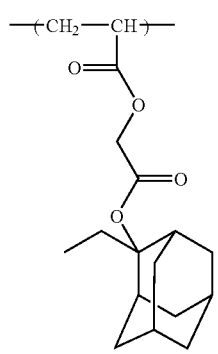 (a1-3-28)
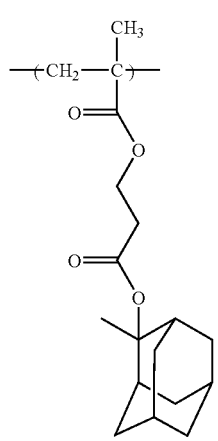 (a1-3-29)
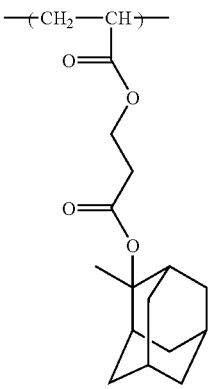 (a1-3-30)
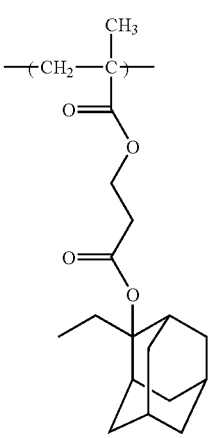 (a1-3-31)
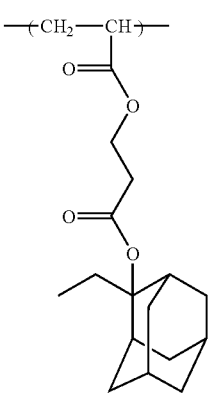 (a1-3-32)
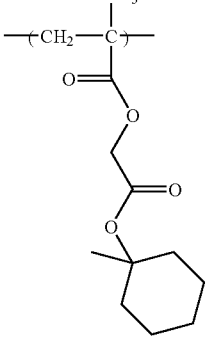 (a1-3-33)

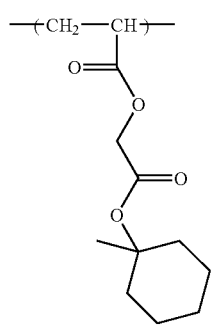 (a1-3-34)
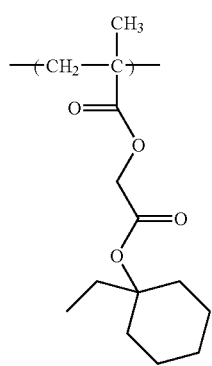 (a1-3-35)
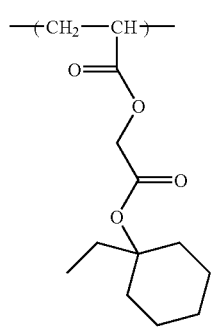 (a1-3-36)
[Chemical Formula 23]
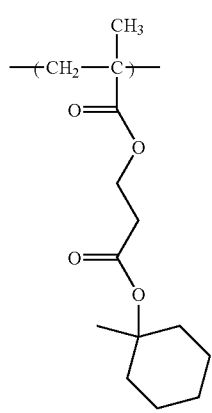 (a1-3-37)
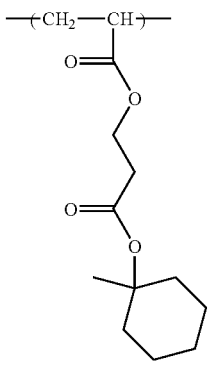 (a1-3-38)
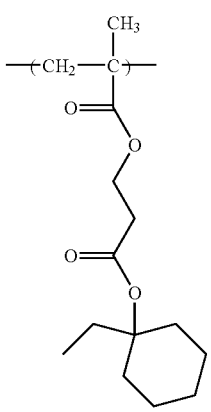 (a1-3-39)
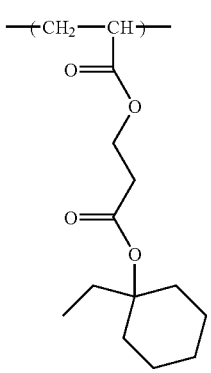 (a1-3-40)
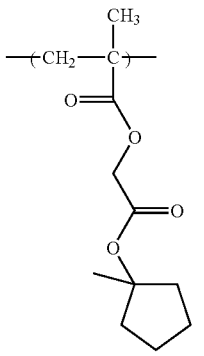 (a1-3-41)

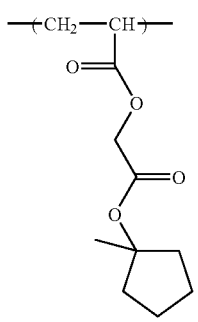 (a1-3-42)
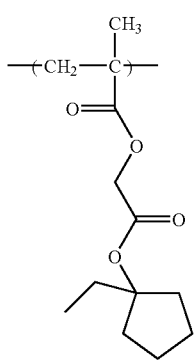 (a1-3-43)
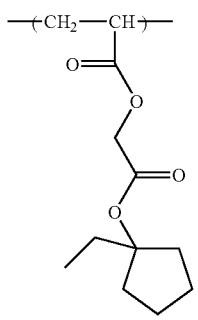 (a1-3-44)
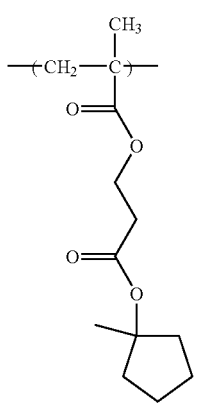 (a1-3-45)
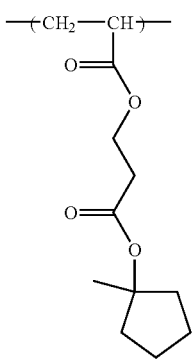 (a1-3-46)
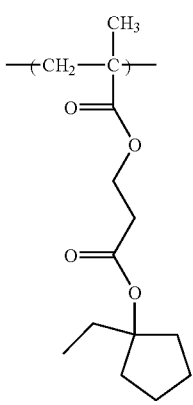 (a1-3-47)
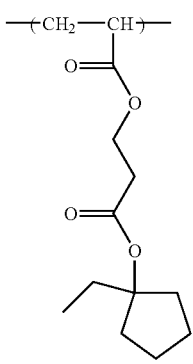 (a1-3-48)
[Chemical Formula 24]
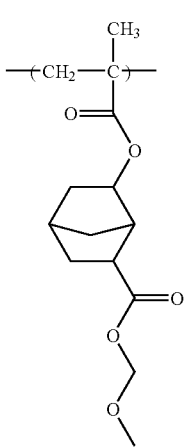 (a1-4-1)

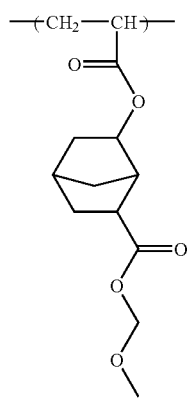
(a1-4-2)
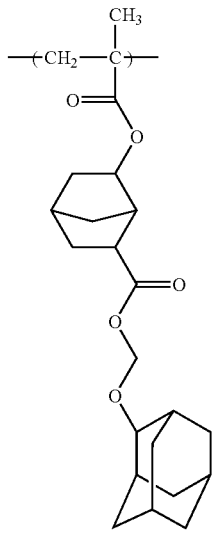
(a1-4-5)
(a1-4-3)
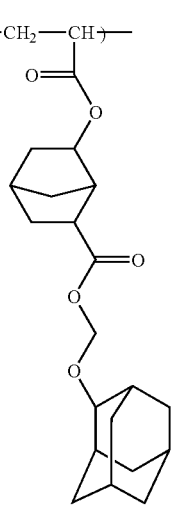
(a1-4-6)
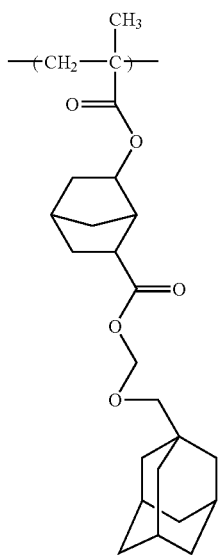
(a1-4-4)
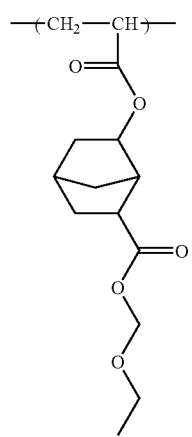
(a1-4-7)

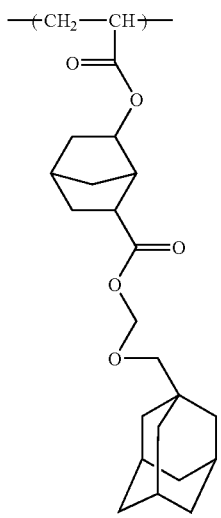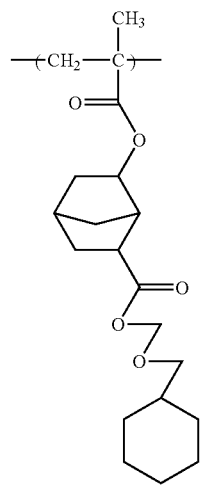

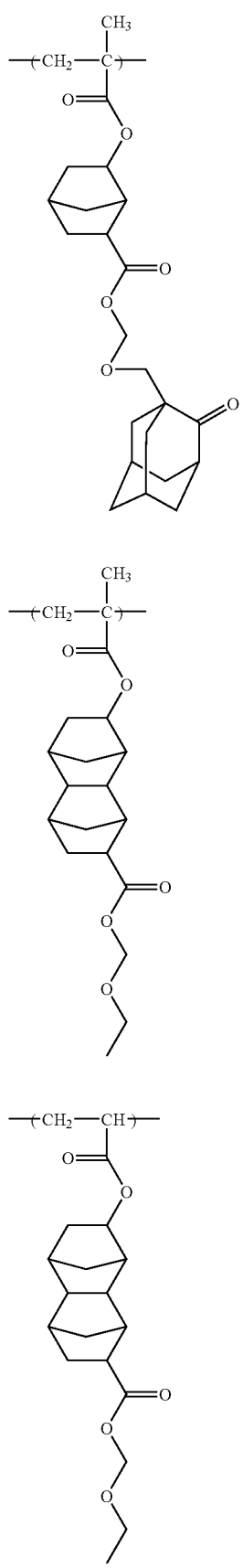
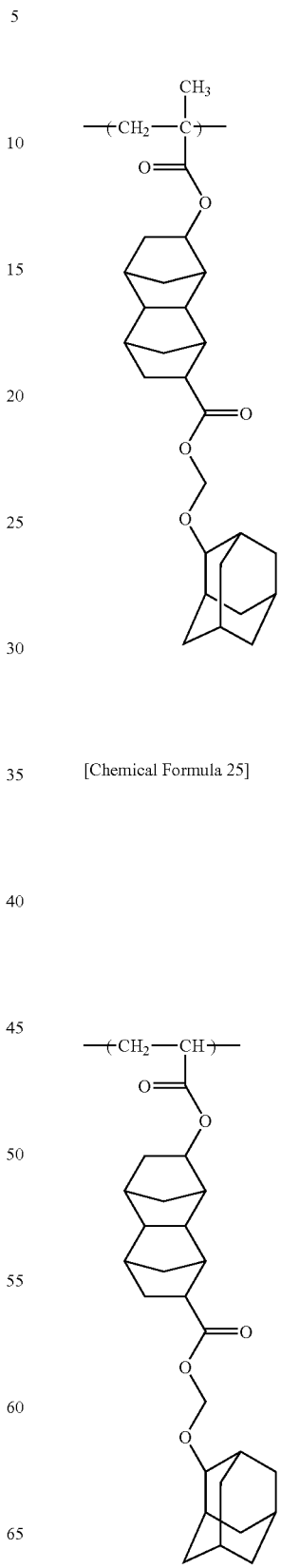
[Chemical Formula 25]

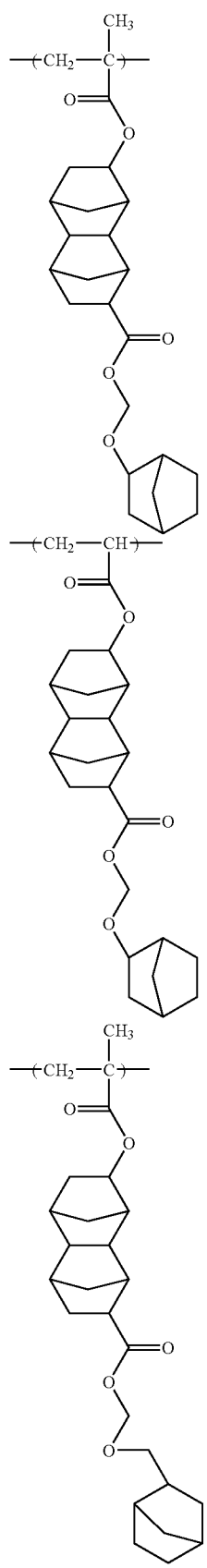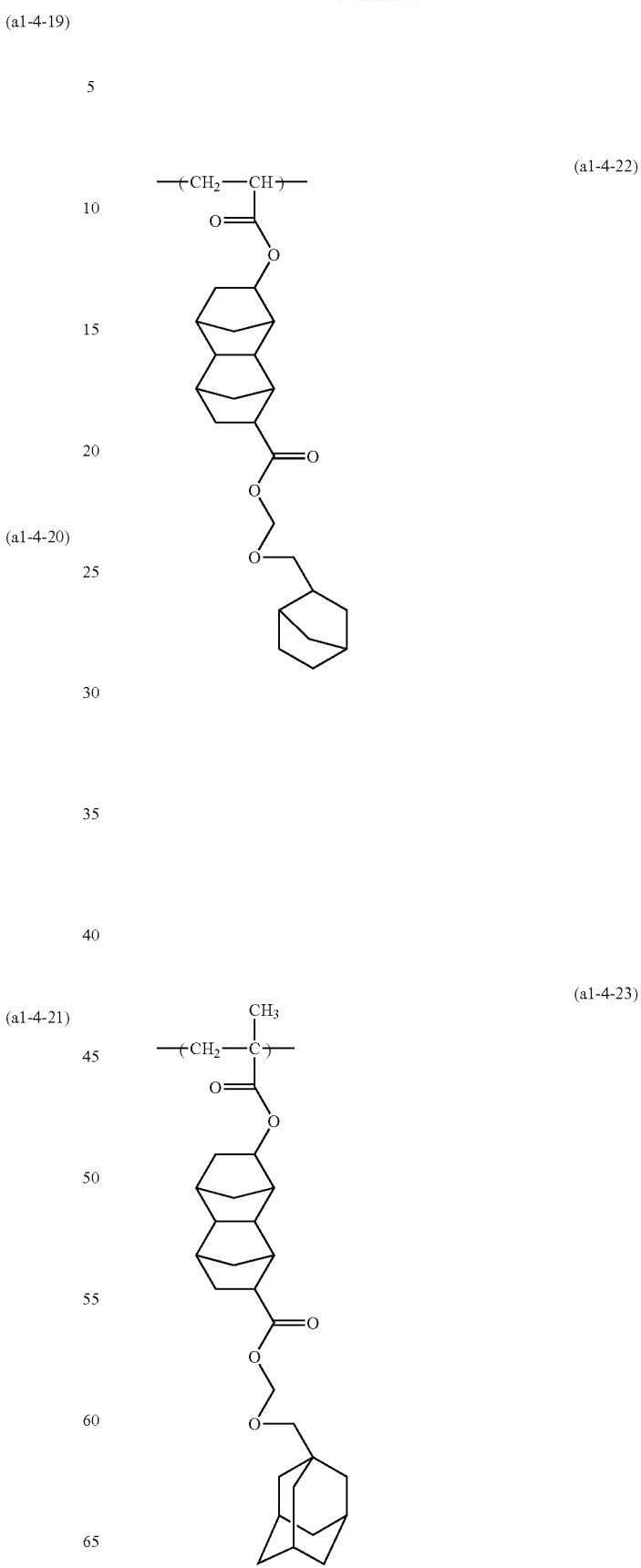

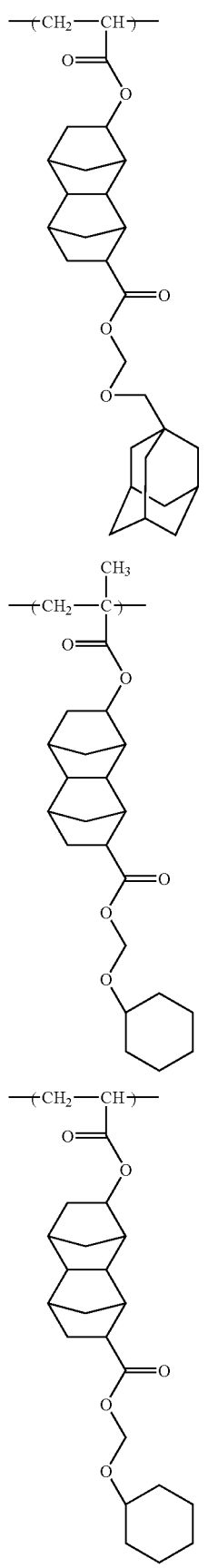
(a1-4-24)
(a1-4-25)
(a1-4-26)
(a1-4-27)
(a1-4-28)

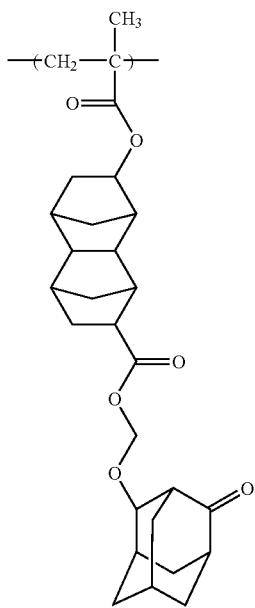

(a1-4-29)

(a1-4-30)

As the structural unit (a1), one type of structural unit may be used alone, or two or more types of structural units may be used in combination.

Among these, structural units represented by general formula (a1-1) are preferable. More specifically, at least one structural unit selected from the group consisting of structural units represented by formulas (a1-1-1) to (a1-1-7) and (a1-1-36) to (a1-1-42) is more preferable.

Further, as the structural unit (a1), structural units represented by general formula (a1-1-01) shown below which includes the structural units represented by formulas (a1-1-1) to (a1-1-5), and structural units represented by general formula (a1-1-02) shown below which includes the structural units represented by formulas (a1-1-36) to (a1-1-42) are also preferable.

[Chemical Formula 26]

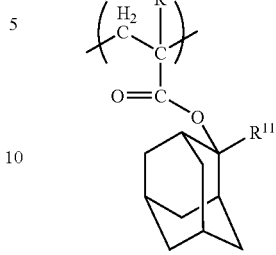

(a1-1-01)

In the formula above, R represents a hydrogen atom, a lower alkyl group or a halogenated lower alkyl group; and $R^{11}$ represents a lower alkyl group.

In general formula (a1-1-01), R is as defined above.

The lower alkyl group for $R^{11}$ is as defined for the lower alkyl group for R. As $R^{11}$, a methyl group or an ethyl group is preferable, and a methyl group is particularly desirable.

[Chemical Formula 27]

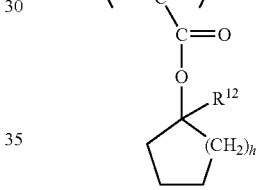

(a1-1-02)

In the formula above, R represents a hydrogen atom, a lower alkyl group or a halogenated lower alkyl group; $R^{12}$ represents a lower alkyl group; and h represents an integer of 1 to 3.

In general formula (a1-1-02), R is as defined above. The lower alkyl group for $R^{12}$ is as defined for the lower alkyl group for R. As $R^{12}$, a methyl group or an ethyl group is preferable, and an ethyl group is particularly desirable. h is preferably 1 or 2, and most preferably 2.

In the component (A), the amount of the structural unit (a1) based on the combined total of all structural units constituting the component (A) is preferably 10 to 80 mol % more preferably 20 to 70 mol %, and still more preferably 25 to 50 mol %, By ensuring that the amount of the structural unit (a1) is at least as large as the lower limit of the above-mentioned range, a pattern can be easily formed using a positive resist composition prepared from the component (A). On the other hand, by ensuring that the amount of the structural unit (a1) is no more than the upper limit of the above-mentioned range, a good balance can be achieved with the other structural units.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from a monocyclic lactone such as γ-butyrolactone or mevalonic lactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 28]

(a2-1)
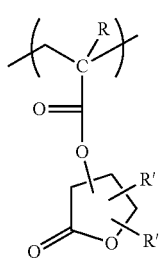

(a2-2)
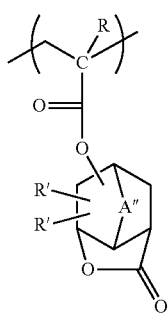

(a2-3)
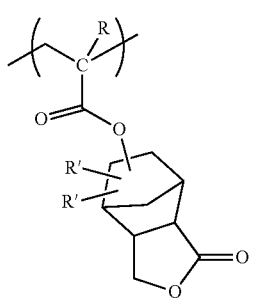

-continued (a2-4)
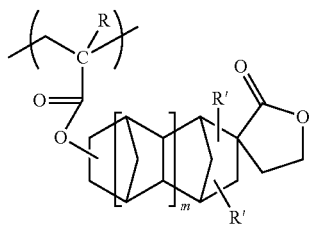

(a2-5)
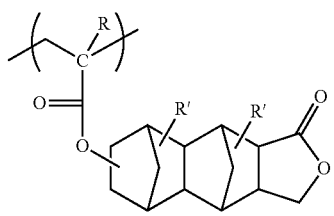

In the formulas above, R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents 0 or 1; and A" represents an alkylene group of 1 to 5 carbon atoms which may contain an oxygen atom or a sulfur atom, an oxygen atom or a sulfur atom.

In general formulas (a2-1) to (a2-5), R is the same as R in the structural unit (a1).

The lower alkyl group for R' is the same as the lower alkyl group for R in the structural unit (a1).

The alkyl group within the alkoxy group for R' is the same as the lower alkyl group for R'.

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, ethylene group, n-propylene group, isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 29]
(a2-1-1)
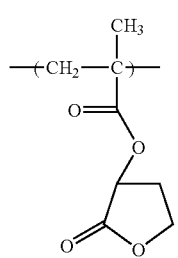
(a2-1-2)
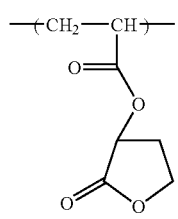
(a2-1-3)
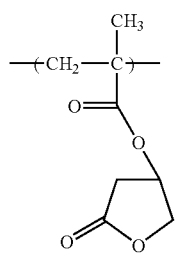
(a2-1-4)
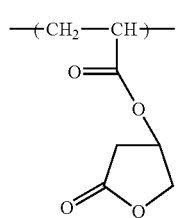
(a2-1-5)
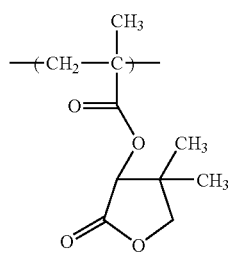
(a2-1-6)
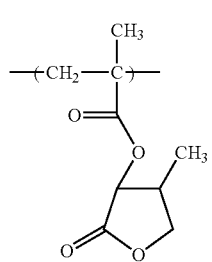
[Chemical Formula 30]
(a2-2-1)
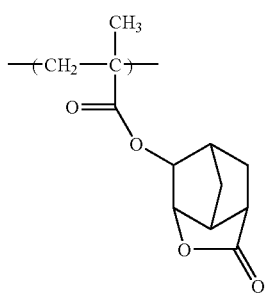
(a2-2-2)
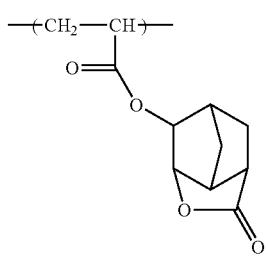
(a2-2-3)
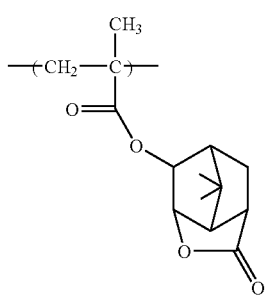
(a2-2-4)
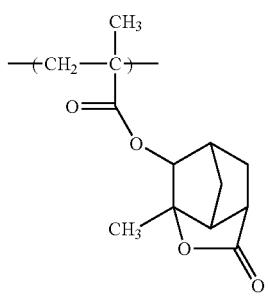
(a2-2-5)
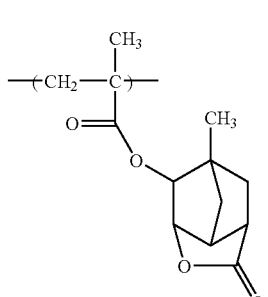
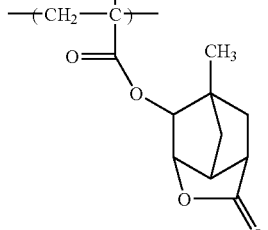

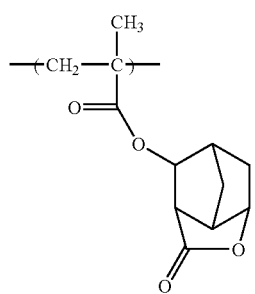 (a2-2-6)
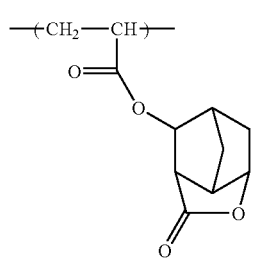 (a2-2-7)
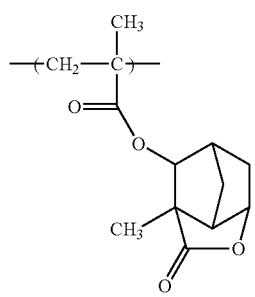 (a2-2-8)
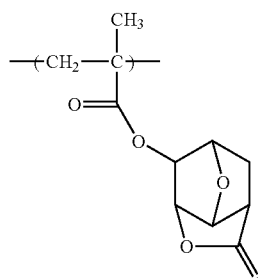 (a2-2-9)
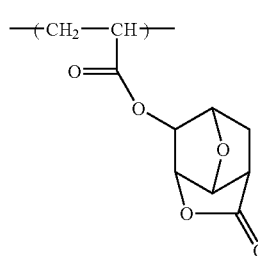 (a2-2-10)
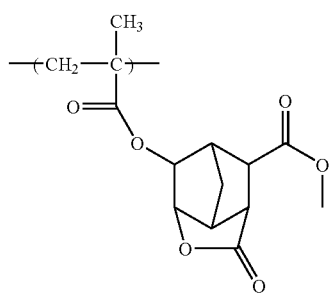 (a2-2-11)
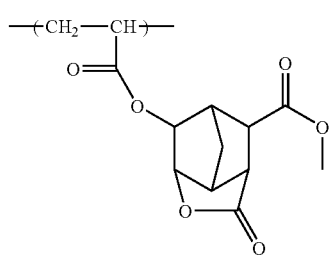 (a2-2-12)
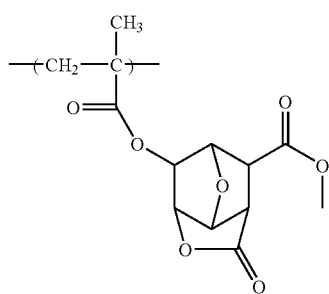 (a2-2-13)
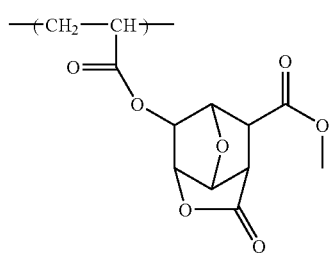 (a2-2-14)
[Chemical Formula 31]
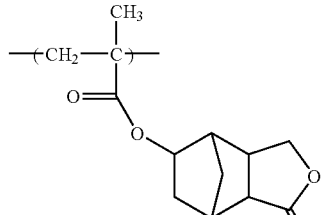 (a2-3-1)
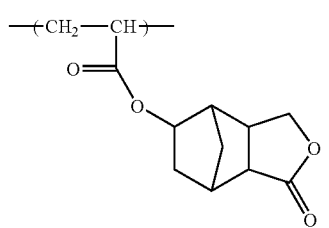 (a2-3-2)

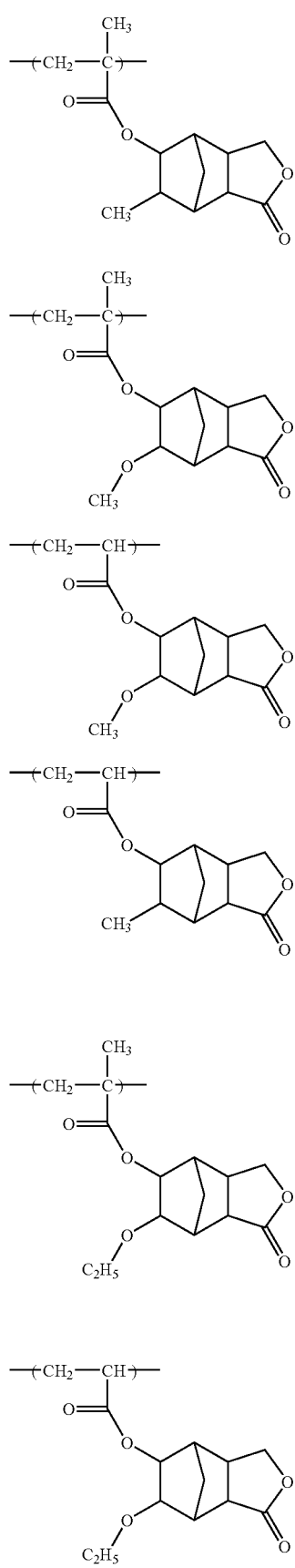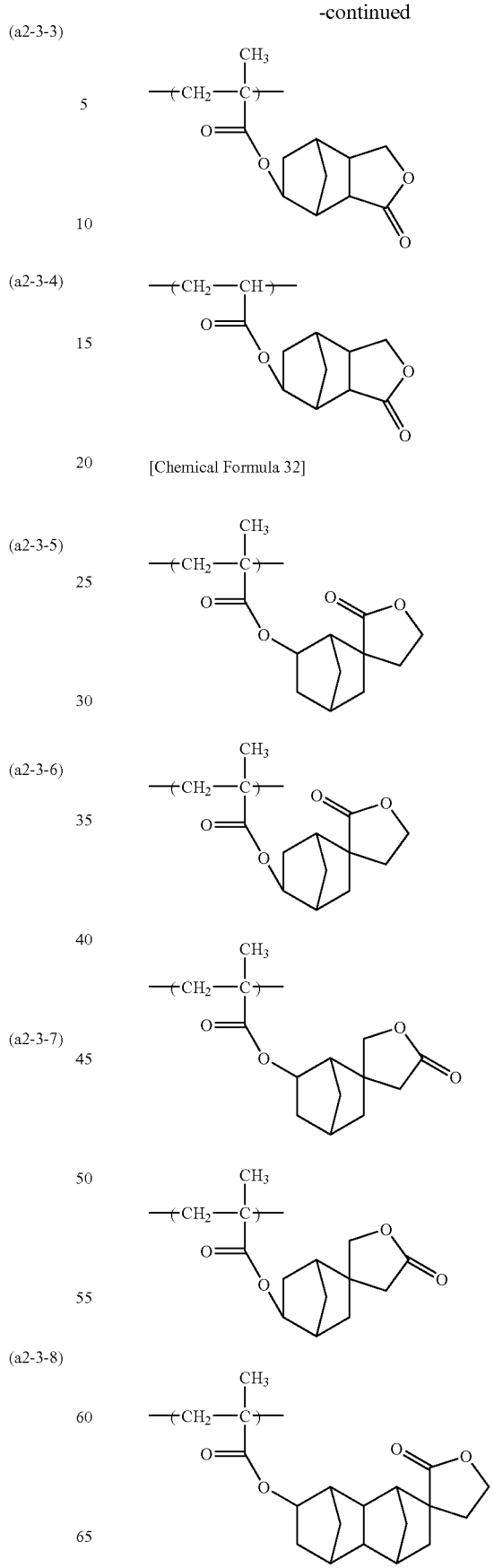

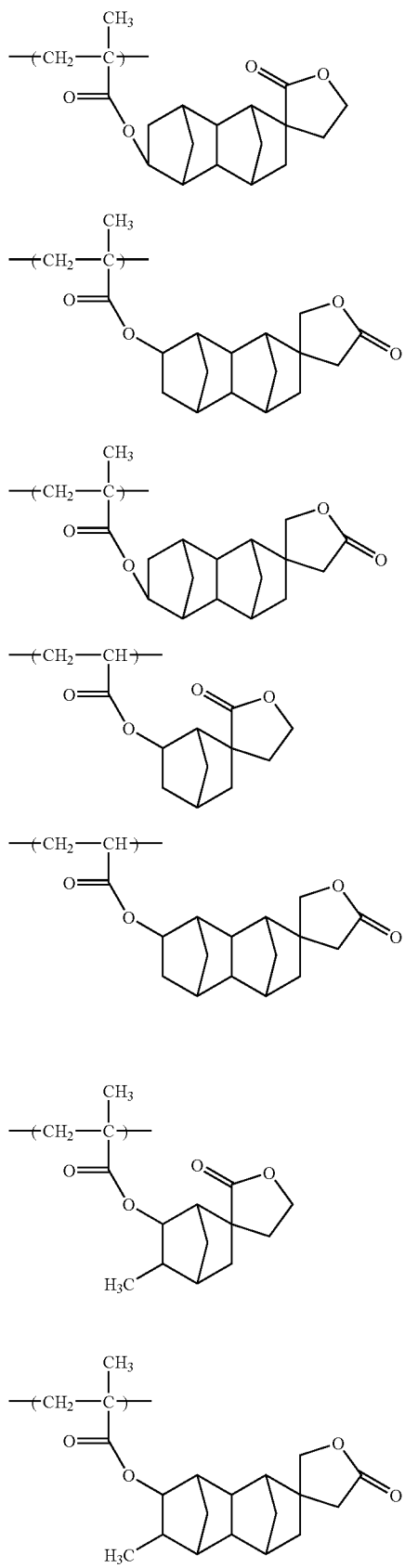

(a2-4-6)
(a2-4-7)
(a2-4-8)
(a2-4-9)
(a2-4-10)
(a2-4-11)
(a2-4-12)

[Chemical Formula 33]

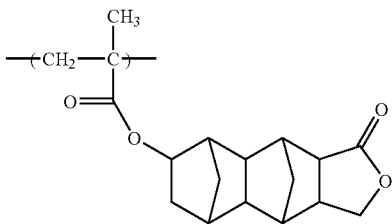
(a2-5-1)

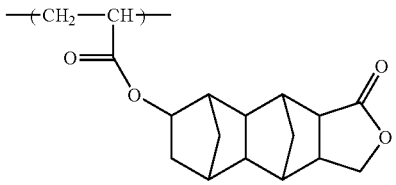
(a2-5-2)

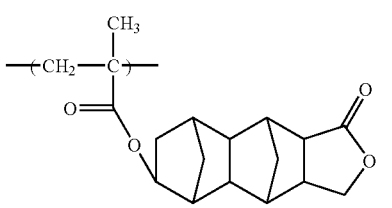
(a2-5-3)

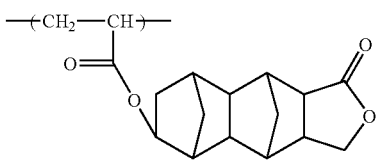
(a2-5-4)

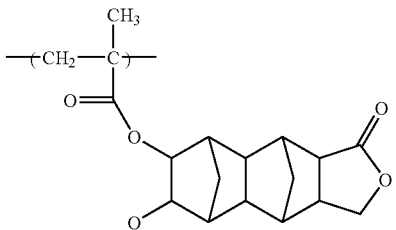
(a2-5-5)

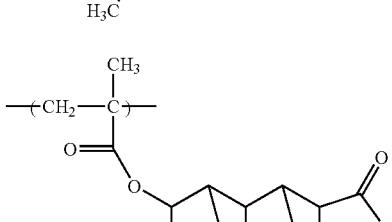
(a2-5-6)

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1)(a2-1-2), (a2-2-1), (a2-2-2), (a2-2-9) (a2-2-10), (a2-3-1), (a2-3-2), (a2-3-9) and (a2-3-10).

In the component (A), the amount of the structural unit (a2) based on the combined total of all structural units constituting the component (A) is preferably 5 to 60 mol %, more preferably 10 to 50 mol %, and still more preferably 20 to 50 mol %. By ensuring that the amount of the structural unit (a2) is at least as large as the lower limit of the above-mentioned range, the effect of using the structural unit (a2) can be satisfactorily achieved. On the other hand, by ensuring that the amount of the structural unit (a2) is no more than the upper limit of the above-mentioned range, a good balance can be achieved with the other structural units.

Structural Unit (a3)

The structural unit (a3) is a structural unit derived from an acrylate ester containing a polar group-containing aliphatic hydrocarbon group.

When the component (A) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 34]

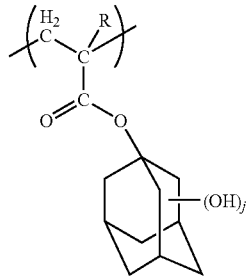
(a3-1)

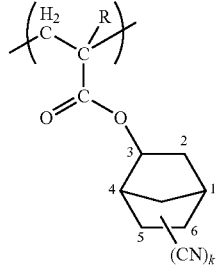
(a3-2)

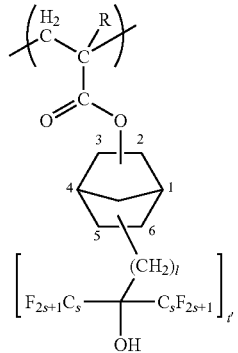
(a3-3)

In the formulas, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbornyl group.

In the component (A), as the structural unit (a3), one type of structural unit may be used, or two or more types may be used in combination.

In the component (A), the amount of the structural unit (a3) based on the combined total of all structural units constituting the component (A) is preferably 5 to 50 mol %, more preferably 5 to 40 mol %, and still more preferably 5 to 25 mol %. By ensuring that the amount of the structural unit (a3) is at least as large as the lower limit of the above-mentioned range, the effect of using the structural unit (a3) can be satisfactorily achieved. On the other hand, by ensuring that the amount of the structural unit (a3) is no more than the upper limit of the above-mentioned range, a good balance can be achieved with the other structural units.

Structural Unit (a4)

The component (A) may also have a structural unit (a4) which is other than the above-mentioned structural units (a0) and (a1) to (a3), as long as the effects of the present invention are not impaired.

As the structural unit (a4), any other structural unit which cannot be classified as one of the above structural units (a0) and (a1) to (a3) can be used without any particular limitations, and any of the multitude of conventional structural units used within resist resins for ArF excimer lasers or KrF excimer lasers (and particularly for ArF excimer lasers) can be used.

As a preferable example of the structural unit (a4), a structural unit (a4') derived from hydroxystyrene can be given. The term "hydroxystyrene" is a general concept which includes hydroxystyrene, hydroxystyrene in which the hydrogen atom on the α-position thereof has been substituted with a substituent such as an alkyl group, and derivatives thereof. The α-position (the carbon on the α-position) of hydroxystyrene refers to the carbon atom bonded to the benzene ring, unless otherwise specified. The term "structural unit derived from hydroxystyrene" refers to a structural unit which is formed by the cleavage of the ethylenic double bond of hydroxystyrene.

In the structural unit (a4'), the hydrogen atom of the phenolic hydroxyl group may be substituted with an acid dissociable, dissolution inhibiting group. Examples of such acid dissociable, dissolution inhibiting groups include the acid dissociable, dissolution inhibiting groups described above in the explanation of the structural unit (a1), and groups containing the acid dissociable, dissolution inhibiting groups. These acid dissociable, dissolution inhibiting groups may include groups that exhibit aromaticity.

Further, as the structural unit (a4), a structural unit which contains a non-acid-dissociable aliphatic polycyclic group, and is also derived from an acrylate ester is also preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 35]

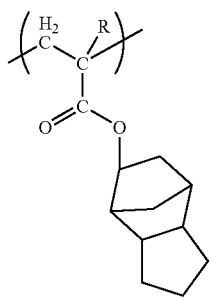
(a4-1)

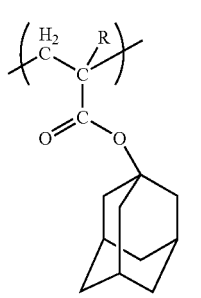
(a4-2)

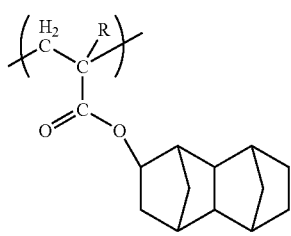
(a4-3)

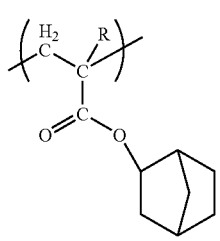
(a4-4)

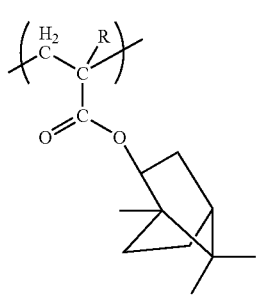
(a4-5)

In the formulas, R is as defined above.

When the structural unit (a4) is included in the component (A), the amount of the structural unit (a4) based on the combined total of all the structural units that constitute the component (A) is preferably within the range from 1 to 30 mol %, and more preferably from 10 to 20 mol %.

In the present invention, the component (A) is a resin component including the structural units (a0) and (a1), and a copolymer (A1) including the structural unit (a0) and the structural unit (a1) can be given as a preferable example.

Specific examples of such a copolymer (A1) include a copolymer consisting of structural units (a0), (a1) and (a2); a copolymer consisting of structural units (a0), (a1) and (a3); a copolymer consisting of structural units (a0), (a1), (a2) and (a3); and a copolymer consisting of structural units (a0), (a1), (a2), (a3) and (a4).

In the component (A), as the copolymer (A1), one type of copolymer may be used alone, or two or more types of copolymers may be used in combination.

In the present invention, as the copolymer (A1), copolymers having a combination of structural units shown below are particularly desirable.

[Chemical Formula 36]

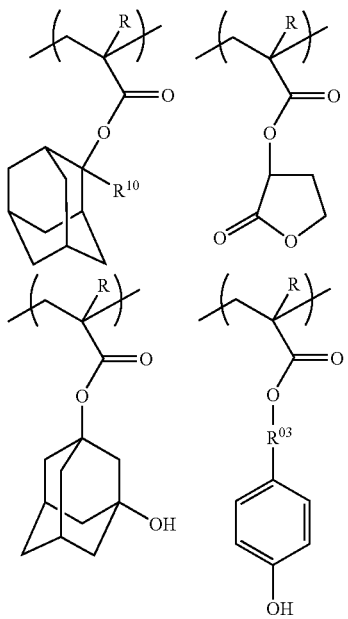

(A1-1)

In the formula, R is as defined above, and the plurality of R may be the same or different from each other; $R^{10}$ represents a lower alkyl group; and $R^{03}$ represents an alkylene group of 1 to 5 carbon atoms which may have a substituent, or a single bond.

In formula (A1-1), the lower alkyl group for $R^{10}$ is as defined above for the lower alkyl group for R. As $R^{10}$, a methyl group or an ethyl group is preferable, and a methyl group is particularly desirable.

The alkylene group for $R^{03}$ is as defined for the alkylene group for $R^{02}$. $R^{03}$ is preferably a single bond.

[Chemical Formula 37]

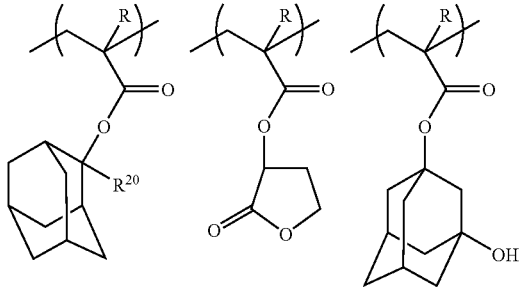

(A1-2)

-continued

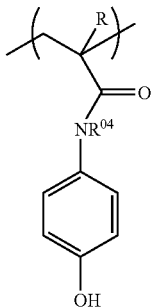

In the formula, R is as defined above, and the plurality of R may be the same or different from each other; $R^{20}$ represents a lower alkyl group; and $R^{04}$ represents a hydrogen atom or a lower alkyl group.

In formula (A1-2), the lower alkyl group for $R^{20}$ is as defined above for the lower alkyl group for R. As $R^{20}$, a methyl group or an ethyl group is preferable, and a methyl group is particularly desirable.

The lower alkyl group for $R^{04}$ is as defined above for the lower alkyl group for R. As $R^{04}$, a hydrogen atom is preferable.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A) is not particularly limited, but is preferably 2,000 to 50,000, more preferably 3,000 to 30,000, and most preferably 5,000 to 20,000. By ensuring that the weight average molecular weight is no more than the upper limit of the above-mentioned range, the component (A) exhibits satisfactory solubility in a resist solvent when used as a resist. On the other hand, by ensuring that the weight average molecular weight is at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3,0, and most preferably 1.2 to 2.5. Here, Mn is the number average molecular weight.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator a compound represented by general formula (b-1) or (b-2) shown below can be preferably used.

[Chemical Formula 38]

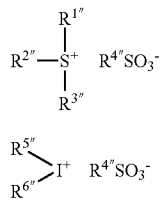

(b-1)

(b-2)

In the formulas above, $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{3\prime\prime}$ to $R^{3\prime\prime}$ are aryl groups.

The aryl group for $R^{1\prime\prime}$ to $R^{3\prime\prime}$ is not particularly limited. For example, an aryl group of 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group of 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group of 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group of 1 to 5 carbon atoms, and most preferably a methoxy group, an ethoxy group, an n-propoxy group, an iso-propoxy group, an n-butoxy group or a tert-butoxy group.

The alkoxy group, with which hydrogen atoms of the aryl group may be substituted, is preferably an alkoxy group of 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group of 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ is a phenyl group or a naphthyl group.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom. When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be exemplified.

$R^{4\prime\prime}$ represents a linear, branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms (i.e., the fluorinated alkyl group is a perfluoroalkyl group) because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same as the aryl groups for $R^{1\prime\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^{3\prime\prime}$ can be exemplified.

It is particularly desirable that both of $R^{5\prime\prime}$ and $R^{6\prime\prime}$ represents a phenyl group.

As $R^{4\prime\prime}$ in formula (b-2), the same as those mentioned above for $R^{4\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 39]

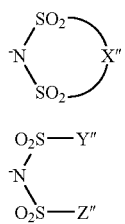

In the formulas, X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 40]

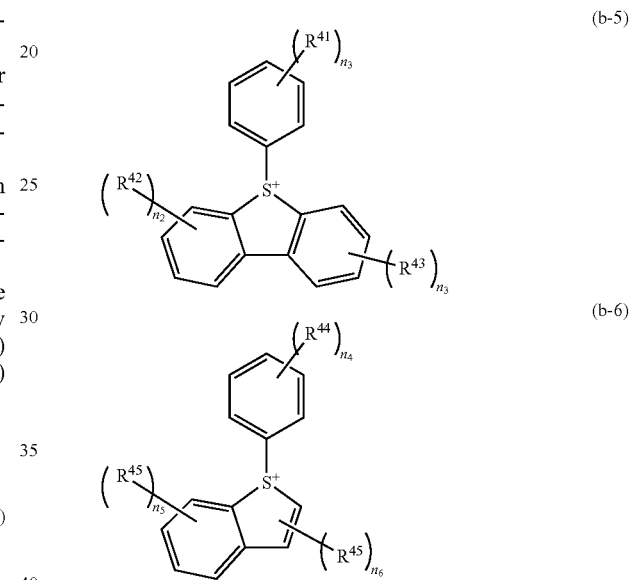

In the formulas, $R^{41}$ to $R^{46}$ each independently represents an alkyl group, an acetyl group, an alkoxy group, a carboxy group, a hydroxyl group or a hydroxyalkyl group; $n_1$ to $n_5$ each independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.
$n_5$ is preferably 0 or 1, and more preferably 0.
$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4'''}SO_3$) for onium salt-based acid generators represented by general formula (b-1) or (b-2) shown above; and anion moieties represented by general formula (b-3) or (b-4) shown above. Among these, fluorinated alkylsulfonic acid ions are preferable, more preferably fluorinated alkylsulfonic acid ions of 1 to 4 carbon atoms, and linear perfluoroalkylsulfonic acid ions of 1 to 4 carbon atoms are particularly desirable. Specific examples include a trifluoromethylsulfonic acid ion, heptafluoro-n-propylsulfonic ion and nonafluoro-n-butylsulfonic acid ion.

In the present description, an oximesulfonate-based acid generator is a compound having at least one group represented by general formula (B-1) shown below, and has a feature of generating acid by irradiation. Such oxime-sulfonate-based acid generators are widely used for a chemically amplified resist composition, and can be appropriately selected.

[Chemical Formula 41]

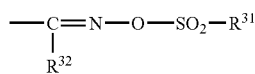
(B-1)

In the formula, $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group of 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 42]

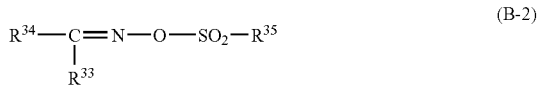
(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 43]

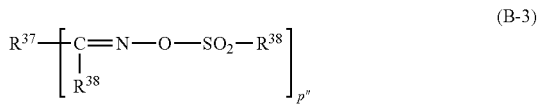
(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)4-methoxyphenyl]acetonitrile, α-(tosyloxyimino)-4-thienyl cyanide, α-(methylsulfonyloxyimino)-1-cyclopentenyl acetonitrile, α-methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be given.

[Chemical Formula 44]

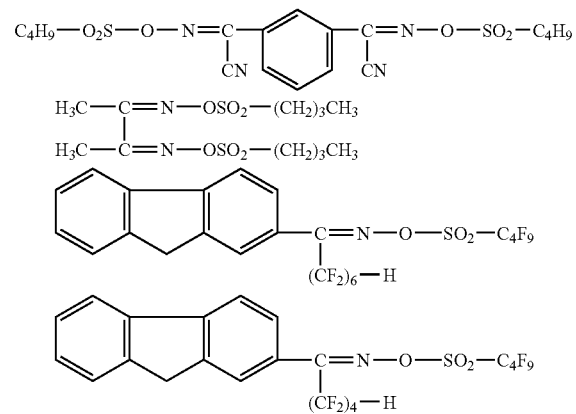

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexanes and 1,10-bis(cyclohexylsulfonyldiazomethylsulfonyl)decane, may be exemplified.

As the component (B), one type of acid generator may be used, or two or more types may be used in combination.

In the present invention, as the component (B), it is preferable to use an onium salt having a fluorinated alkylsulfonic acid ion as the anion moiety.

In the positive resist composition of the present invention, the amount of the component (B) relative to 100 parts by weight of the component (A) is preferably 0.5 to 30 parts by weight, and more preferably 1 to 20 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

[Component (D)]

In the positive resist composition of the present invention, for improving the resist pattern shape and the post exposure stability of the latent image formed by the pattern-wise exposure of the resist layer, it is preferable to further include a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

In the present invention, as the component (D), it is preferable to use an alkyl amine, and it is particularly desirable to use a trialkylamine of 5 to 10 carbon atoms.

The component (D) is typically used in an amount within a range from 0.01 to 5.0 parts by weight, relative to 100 parts by weight of the component (A).

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphide acid. Among these, phosphoric acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Component (S)>

The positive resist composition of the present invention can be prepared by dissolving the materials for the positive resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol mono-methyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

The positive resist composition of the present invention exhibits small variation in the resist pattern size when the exposure dose is changed (i.e., exhibits a large EL margin).

The positive resist composition of the present inventions contains a resin component (A) that includes a structural unit (a0) represented by general formula (a0) which is derived from a monomer exhibiting a low pKa (acid dissociation constant) and exhibits excellent solubility in an alkali developing solution, and a structural unit (a1) derived from an acrylate ester containing an acid dissociable, dissolution inhibiting group exclusive of groups that exhibit aromaticity.

Although the reason why the effects of the present invention can be achieved has not been elucidated yet, it is presumed that by using a combination of the structural unit (a0) and the structural unit (a1), an interaction occurs between the structural unit (a0) and the structural unit (a1), thereby enabling to achieve the effects of the present invention.

Further, by using the positive resist composition of the present invention, a resist pattern having an excellent rectangularity and an excellent shape can be formed.

Furthermore, the positive resist composition of the present invention is capable of improving various lithography properties such as resolution and line width roughness (LWR). LWR is a phenomenon in which the line width of a line pattern becomes heterogeneous when a resist pattern is formed using a resist composition, and improvement in the level of LWR becomes an important issue as pattern miniaturization progresses.

Moreover, in the positive resist composition of the present invention, by adjusting the amount of the structural unit (a0), the dissolution rate of the unexposed portions of the resist film in an alkali developing solution can be controlled. As a result, it becomes possible to reduce the generation of defects on the surface of the resist pattern formed.

<<Method of Forming a Resist Pattern>>

Next, the method of forming a resist pattern according to the second aspect of the present invention will be described.

The method of forming a resist pattern according to the present invention includes: applying a positive resist composition of the present invention to a substrate to form a resist film on the substrate; conducting exposure of the resist film; and alkali-developing the resist film to form a resist pattern.

More specifically, the method of forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, the resist film is selectively exposed to electron beam (EB) through a desired mask pattern using an EB exposure apparatus or the like. Thereafter, post exposure bake (PEB) is conducted under temperature conditions of 80 to 150° C. for 40 to 120 seconds, preferably 60 to 90 seconds.

Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) can be exemplified.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to lithography using KrF excimer laser, ArF excimer laser, EB or EUV, and particularly effective to lithography using EB or EUV.

EXAMPLES

As follows is a description of examples of the present invention, although the scope of the present invention is by no way limited by these examples.

<Synthesis of Resin Component (A)>

Copolymers (A)-2 to (A)-5 used as the component (A) in Examples 1 to 4 were obtained by a conventional dropwise polymerization method using monomers (1) to (5) below.

[Chemical Formula 45]

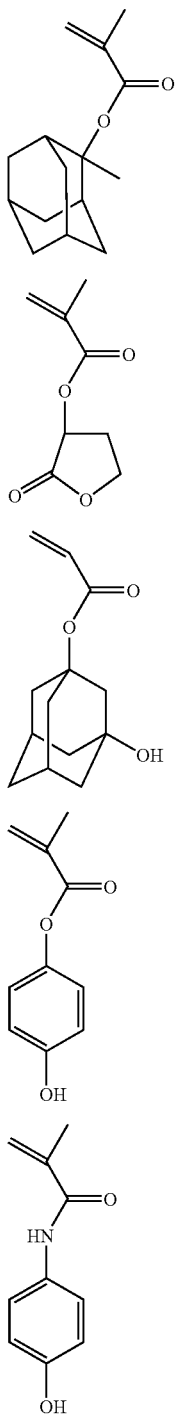

Monomer (1)

Monomer (2)

Monomer (3)

Monomer (4)

Monomer (5)

Synthesis Example 1

Synthesis of Copolymer (A)2

167 parts by weight of ethyl lactate was charged into a flask equipped with a nitrogen feeding pipe, a stirrer, a condenser, a dropping funnel and a thermometer in a nitrogen atmosphere. The flask was placed in warm water bath, and the temperature of the water bath was elevated to 80° C. while stirring the content of the flask. Then, a mixture containing 59.5 parts by weight of a monomer (2), 70.2 parts by weight of a monomer (1), 44.4 parts by weight of a monomer (3), 26.7 parts by weight of a monomer (4), 301 parts by weight of ethyl lactate and 12.65 parts by weight of dimethyl 2,2'-azobisbutyrate (product name: V601; manufactured by Wako Pure Chemical Industries, Ltd.) was dropwise added to the flask over 4 hours using the dropping funnel, and the temperature was maintained at 80° C. for 3 hours.

Subsequently, the reaction solution was dropwise added to a mixed solvent containing methanol and water (methanol/water=70/30 (volume ratio)) in an amount of about 10 times that of the reaction solvent while stirring, thereby obtaining a white precipitate. The precipitate was separated by filtration, and was added to a mixed solvent containing methanol and water (methanol/water=70/30 (volume ratio)) in an amount of about 10 times that of the reaction solvent, followed by stirring to wash the precipitate. Thereafter, the precipitate was separated by filtration to obtain a wet polymer powder. The obtained wet polymer powder was dried at 40° C. under reduced pressure for about 40 hours, thereby obtaining a copolymer (A)-2.

Synthesis Example 2

Synthesis of Copolymer (A)-3

A copolymer (A)-3 was obtained in the same manner as in Synthesis Example 1, except that the amount of monomer (2) was changed to 71.4 parts by weight, and the amount of monomer (4) was changed to 14.2 parts by weight.

Synthesis Example 3

Synthesis of Copolymer (A)-4

167 parts by weight of ethyl lactate was charged into a flask equipped with a nitrogen feeding pipe, a stirrer, a condenser, a dropping funnel and a thermometer in a nitrogen atmosphere. The flask was placed in warm water bath, and the temperature of the water bath was elevated to 80° C. while stirring the content of the flask. Then, a mixture containing 51.0 parts by weight of a monomer (2), 70.2 parts by weight of a monomer (1), 44.4 parts by weight of a monomer (3), 35.4 parts by weight of a monomer (5), 301 parts by weight of ethyl lactate and 12.65 parts by weight of dimethyl 2,2'-azobisbutyrate (product name: V601; manufactured by Wako Pure Chemical Industries, Ltd.) was dropwise added to the flask over 4 hours using the dropping funnel, and the temperature was maintained at 80° C. for 3 hours.

Subsequently, the reaction solution was dropwise added to a mixed solvent containing methanol and water (methanol/water=70/30 (volume ratio)) in an amount of about 10 times that of the reaction solvent while stirring, thereby obtaining a white precipitate. The precipitate was separated by filtration, and was added to a mixed solvent containing methanol and water (methanol/water=70/30 (volume ratio)) in an amount of about 10 times that of the reaction solvent, followed by stirring to wash the precipitate. Thereafter, the precipitate was separated by filtration to obtain a wet polymer powder. The obtained wet polymer powder was dried at 40° C. under reduced pressure for about 40 hours, thereby obtaining a copolymer (A)-4.

Synthesis Example 4

Synthesis of Copolymer (A)-5

A copolymer (A)-5 was obtained in the same manner as in Synthesis Example 3, except that the amount of monomer (2) was changed to 34.0 parts by weight, and the amount of the monomer (5) was changed to 53.1 parts by weight.

The structures of the obtained copolymers are indicated by the chemical formulas shown below.

Chemical formula (A1-11) shows the structure of copolymers (A)-2 and (A)-3, and chemical formula (A1-21) shows the structure of copolymers (A)-4 and (A)-5.

In the formulas, the subscript characters (a1, a2, a3, a01, a02) on the brackets indicate the amount (mol %) of the individual structural units, base on the total amount of all structural units constituting the copolymer.

Each of the copolymers (A)-2 to (A)-5 was analyzed by carbon 13 nuclear magnetic resonance spectroscopy (600 MHz, $^{13}$C-NMR) to determine the amount of the individual structural units. Further, the weight average molecular weight (Mw) and the dispersity (Mw/Mn) were determined by the polystyrene equivalent value as measured by gel permeation chromatography (GPC). The results are shown in Table 1.

In Table 1, "-" indicates that the corresponding structural unit is not included in the copolymer.

TABLE 1

[Chemical. Formula 46]

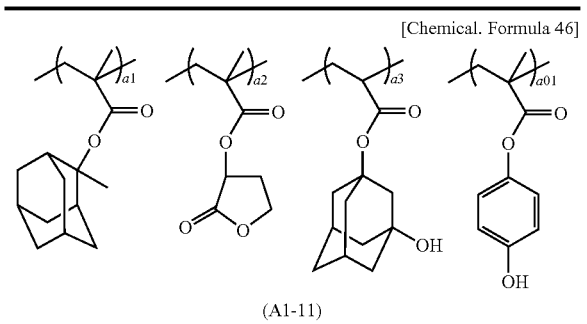

(A1-11)

[Chemical. Formula 47]

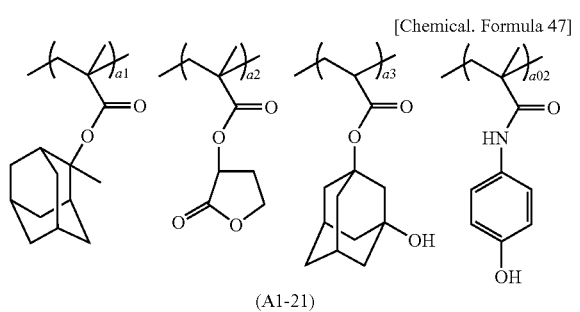

(A1-21)

| Chemical Formula | Copolymer | a1 | a2 | a3 | a01 | a02 | Mw | Mw/Mn |
|---|---|---|---|---|---|---|---|---|
| (A1-11) | (A)-2 | 30 | 35 | 20 | 15 | — | 6300 | 1.7 |
|  | (A)-3 | 30 | 42 | 20 | 8 | — | 6300 | 1.7 |
| (A1-21) | (A)-4 | 30 | 30 | 20 | — | 20 | 6300 | 1.7 |
|  | (A)-5 | 30 | 20 | 20 | — | 30 | 6300 | 1.7 |

<Production of Positive Resist Compositions>

The components shown in Table 2 were mixed together and dissolved to obtain positive resist compositions.

TABLE 2

| | Component (A) | Component (B) | Component (D) | Component (S) |
|---|---|---|---|---|
| Comp. Ex. 1 | (A)-1 [100] | (B)-1 [13] | (D)-1 [1.0] | (S)-1 [4445] |
| Ex. 1 | (A)-2 [100] | (B)-1 [13] | (D)-1 [1.0] | (S)-1 [4445] |
| Ex. 2 | (A)-3 [100] | (B)-1 [13] | (D)-1 [1.0] | (S)-1 [4445] |
| Ex. 3 | (A)-4 [100] | (B)-1 [13] | (D)-1 [1.0] | (S)-1 [4445] |
| Ex. 4 | (A)-5 [100] | (B)-1 [13] | (D)-1 [1.0] | (S)-1 [4445] |

In Table 2, the reference characters indicate the following. Further, the values in brackets [ ] indicate the amount (in terms of parts by weight) of the component added.

(A)-1: a copolymer represented by formula (A2) shown below (a1/a2/a3=30/50/20 (molar ratio); Mw=7,000, Mw/Mn=1.7)

[Chemical Formula 48]

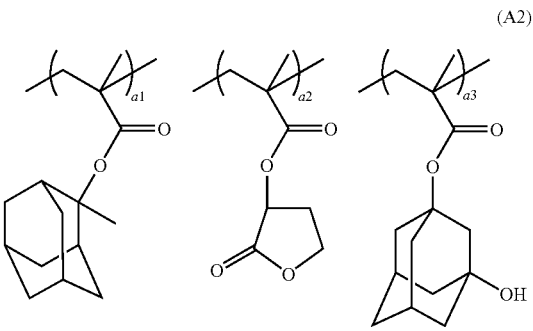

(A)-2: aforementioned copolymer (A)-2
(A)-3: aforementioned copolymer (A)-3
(A)-4: aforementioned copolymer (A)-4
(A)-5: aforementioned copolymer (A)-5
(B)-1: triphenylsulfonium nonafluoro-n-butanesulfonate
(D)-1: tri-n-octylamine
(S)-1: a mixed solvent of PGMEA/PGME=6/4 (weight ratio)

<Evaluation of Lithography Properties>

Using the obtained positive resist compositions, resist patterns were formed, and the exposure margin (EL margin) and the shape of the resist pattern were evaluated as follows.

[Formation of Resist Pattern]

Each of the positive resist compositions was uniformly applied onto an 8-inch silicon wafer that had its surface treated (at 90° C. for 36 seconds) with hexamethyldisilazane (HMDS), and was then prebaked (PAB) at a PAB temperature indicated in Table 3 for 60 seconds, thereby forming a resist film with a film thickness of 60 nm.

The obtained resist film was subjected to direct patterning with an electron beam lithography apparatus (product name: HL-800D; manufactured by Hitachi Ltd.; accelerating voltage: 70 kV, 7 A/cm$^2$). Thereafter, a post exposure bake (PEB) treatment was conducted at a PEB temperature indicated in Table 3 for 60 seconds, followed by development for 60 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 15 seconds with pure water, followed by drying by shaking, thereby forming a line and space (1:1) resist pattern (hereafter, referred to as "L/S pattern") with a line width of 100 nm and a pitch of 200 nm. The optimum exposure dose (µC/cm²) with which an L/S pattern having a line width of 100 nm and a pitch of 200 nm could be formed was determined.

[Evaluation of EL Margin]

With respect to the above Eop, the exposure dose with which an L/S pattern having a dimension of the target dimension (line width: 100 nm)±10% (i.e., 95 nm to 105 nm) was determined, and the EL margin (unit: %) was determined by the following formula. The results are shown in Table 3.

EL margin (%)=(|E1−E2|/Eop)×100

E1: exposure dose (mJ/cm²) for forming an L/S pattern having a line width of 95 nm.
E2: exposure dose (mJ/cm²) for forming an L/S pattern having a line width of 105 nm.

[Evaluation of Resist Pattern Shape]

The cross-sectional shape of the L/S pattern having a line width of 100 nm and a pitch of 200 nm as formed in the [formation of resist pattern] was observed by a scanning electron microscope ((product name: S-9220, manufactured by Hitachi, Ltd.)), and the shape of the resist pattern was evaluated. The results are shown in Table 3.

TABLE 3

| | PAB (° C.) | PEB (° C.) | Eop (µC/cm²) | EL margin (%) | Shape of resist pattern |
|---|---|---|---|---|---|
| Comp. Ex. 1 | 110 | 110 | 34 | 11.6 | T-top |
| Ex. 1 | 110 | 110 | 32 | 13.0 | Rectangular |
| Ex. 2 | 110 | 110 | 36 | 13.3 | Rectangular |
| Ex. 3 | 110 | 110 | 42 | 19.4 | Rectangular |
| Ex. 4 | 110 | 110 | 40 | 15.1 | Rectangular |

From the results shown in Table 3, it was confirmed that each of the positive resist compositions of Examples 1 to 4 exhibited a larger EL margin value than that of the positive resist composition of Comparative Example 1, and hence, the variation in the resist pattern size when the exposure dose was changed was small.

Further, with respect to the positive resist compositions of Examples 1 to 4, it was confirmed that a resist pattern exhibiting a high rectangularity and having an excellent shape could be formed.

On the other hand, with respect to the positive resist composition of Comparative Example 1, a resist pattern having a T-top shape was formed, which meant that the resist pattern shape was extremely poor.

Furthermore, in the [formation of resist pattern], an L/S pattern having an L/S ratio (ratio of the line width to the space width) of 1:1 was formed using the same exposure dose as the above Eop, to thereby evaluate the resolution. As a result, it was confirmed that the positive resist compositions of Examples 1 to 4 exhibited about the same level of high resolution as that of the positive resist composition of Comparative Example 1.

What is claimed is:

1. A positive resist composition comprising a resin component (A) which exhibits increased solubility in an alkali developing solution under action of acid and an acid-generator component (B) which generates acid upon exposure, said resin component (A) comprising a structural unit (a0) represented by general formula (a0) shown below, a structural unit (a1) derived from an acrylate ester containing an acid dissociable, dissolution inhibiting group exclusive of groups that exhibit aromaticity, and a structural unit (a2) derived from an acrylate ester containing a lactone-containing cyclic group and a structural unit (a3) represented by general formula (a3-1) shown below:

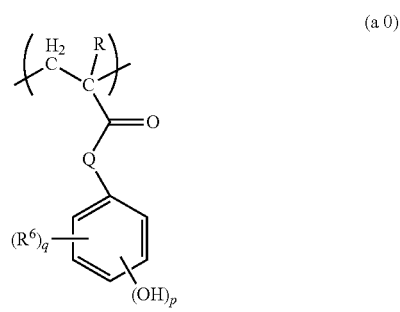

(a0)

wherein R represents a hydrogen atom, a lower alkyl group of 1 to 5 carbon atoms or a halogenated lower alkyl group of 1 to 5 carbon atoms; Q represents a divalent linking group, containing a nitrogen atom, —O—, —O—R⁰²— or —O—R⁰²—O—C(O)—, wherein R⁰² represents a linear alkylene group; R⁶ represents a lower alkyl group of 1 to 5 carbon atoms or an alkoxy group of 1 to 5 carbon atoms; p represents an integer of 1 to 3; and q represents an integer of 0 to 2;

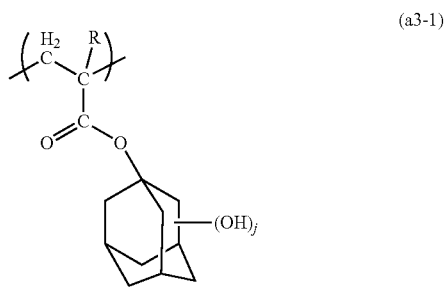

(a3-1)

wherein R represents a hydrogen atom, a lower alkyl group of 1 to 5 carbon atoms or a halogenated lower alkyl group of 1 to 5 carbon atoms; and j is an integer of 1 to 3.

2. The positive resist composition according to claim 1, which further comprises a nitrogen-containing organic compound (D).

3. A method of forming a resist pattern, comprising: applying a positive resist composition of claim 1 or 2 to a substrate to form a resist film on the substrate; conducting exposure of said resist film; and alkali-developing said resist film to form a resist pattern.

4. The positive resist composition according to claim 1, wherein Q represents —O—, —O—R⁰²—O—C(O)— or a divalent linking group containing a nitrogen atom.

5. A positive resist composition comprising a resin component (A) which exhibits increased solubility in an alkali developing solution under action of acid and an acid-generator component (B) which generates acid upon exposure, said resin component (A) comprising a structural unit (a0) represented by general formula (a0) shown below and a structural unit (a1) derived from an acrylate ester containing an acid dissociable, dissolution inhibiting group exclusive of groups that exhibit aromaticity, and a structural unit (a2) derived from an acrylate ester containing a lactone-containing cyclic group and a structural unit (a3) represented by general formula (a3-1) shown below:

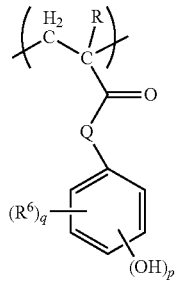
(a0)

wherein R represents a hydrogen atom, a lower alkyl group of 1 to 5 carbon atoms or a halogenated lower alkyl group of 1 to 5 carbon atoms; Q represents —NH—, —NR$^{01}$—, —NH—R$^{02}$—, —NR$^{01}$—R$^{02}$—, —O—, —O—R$^{02}$—O—C(O)—, —NH—C(O)—NH— or —O—R$^{02}$—NH—C(O)—NH—, wherein R$^{01}$ represents a lower alkyl group of 1 to 5 carbon atoms, and R$^{02}$ represents a linear alkylene group of 1 to 5 carbon atoms which may have a substituent; R$^6$ represents a lower alkyl group of 1 to 5 carbon atoms or an alkoxy group of 1 to 5 carbon atoms; p represents an integer of 1 to 3; and q represents an integer of 0 to 2

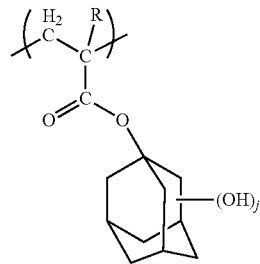
(a3-1)

wherein R represents a hydrogen atom, a lower alkyl group of 1 to 5 carbon atoms or a halogenated lower alkyl group of 1 to 5 carbon atoms; and j is an integer of 1 to 3.

6. The positive resist composition according to claim 1, wherein Q in general formula (a0) represents —O— or —NH—.

* * * * *

UNITED STATES PATENT AND TRADEMARK OFFICE
CERTIFICATE OF CORRECTION

| | |
|---|---|
| PATENT NO. | : 8,263,307 B2 |
| APPLICATION NO. | : 12/427547 |
| DATED | : September 11, 2012 |
| INVENTOR(S) | : Makiko Irie and Takeshi Iwai |

It is certified that error appears in the above-identified patent and that said Letters Patent is hereby corrected as shown below:

In the Specifications

At Column 1, Line 30, Change "j-line" to -- i-line --.

At Column 2, Line 8, Change "opposition" to -- α-position --.

At Column 5, Line 38, Change "—C(CH$_3$)$_2$—;" to -- —C(CH$_3$)$_2$—, --.

At Column 5, Line 44, Change "altyltrimethylene" to -- alkyltrimethylene --.

At Column 18, Line 52, Change "Lower" to -- lower --.

At Column 18, Line 53, Change "position" to -- α-position --.

At Column 68, Line 66, Change "(a2-1-1)(a2-1-2)," to -- (a2-1-1), (a2-1-2), --.

At Column 68, Line 66, Change "(a2-2-9)" to -- (a2-2-9), --.

At Column 69, Line 3, Change "60mol %" to -- 60 mol % --.

At Column 69, Line 50, After "from" insert -- a --.

At Column 70, Line 56, Change "1,l" to -- 1, 1 --.

At Column 70, Line 58, Change "2-norbonyl" to -- 2-norbornyl --.

At Column 70, Line 58, Change "3-norbonyl" to -- 3-norbornyl --.

At Column 74, Line 19, Change "far" to -- for --.

Signed and Sealed this
Seventh Day of May, 2013

Teresa Stanek Rea
*Acting Director of the United States Patent and Trademark Office*

CERTIFICATE OF CORRECTION (continued)
U.S. Pat. No. 8,263,307 B2

At Column 74, Line 24, Change "$R^{04}$," to -- $R^{04}$, --.

At Column 74, Line 52, Change "3,0," to -- 3.0, --.

At Column 75, Line 29, Change "$R^{3''}$" to -- $R^{1''}$ --.

At Column 78, Line 17-40 (Approx.),

Change "[Chemical Formula 40]

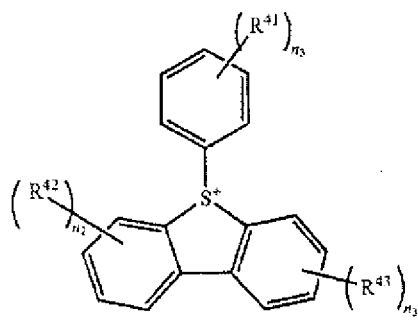
(b-5)

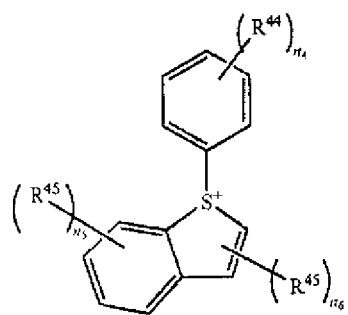
(b-6)
"

to -- [Chemical Formula 40]

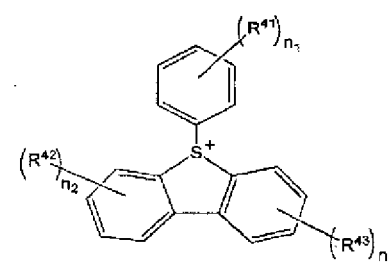
(b-5)

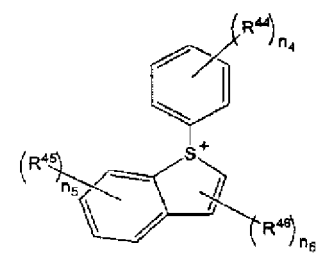
(b-6)
--.

CERTIFICATE OF CORRECTION (continued)
U.S. Pat. No. 8,263,307 B2

At Column 80, Line 35-40 (Approx.),
    [Chemical Formula 43]

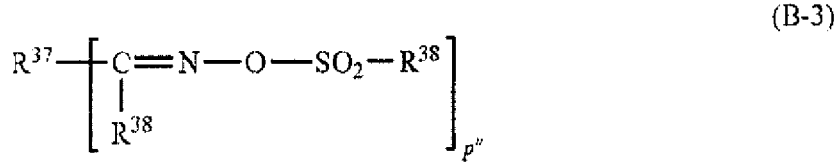

(B-3)

Change "

"

[Chemical Formula 43]

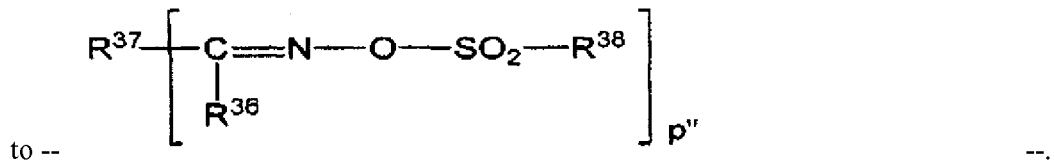

(B-3)

to --

--.

At Column 80, Line 60, Change "phenantryl" to -- phenanthryl --.

At Column 81, Line 36, Change ")2,4" to -- )-2,4 --.

At Column 81, Line 44, Change ")4" to -- )-4 --.

At Column 82, Line 55, Change "hexanes" to -- hexane, --.

At Column 83, Line 48, Change "[4.3,0]" to -- [4.3.0] --.

At Column 84, Line 5, Change "phosphide" to -- phosphinic --.

At Column 85, Line 3, Change "mono-methyl" to -- monomethyl --.

At Column 86, Line 2, Change "fanning" to -- forming --.

At Column 87, Line 62 (Approx.), Change "(A)2" to -- (A)-2 --.

At Column 89, Line 17, Change "base" to -- based --.

At Column 91, Line 4, Change "of200" to -- of 200 --.

In the Claims

At Column 92, Line 23, In Claim 1, change "group ," to -- group --.

At Column 92, Line 66, In Claim 5, change "aromaticity ,and" to -- aromaticity, and --.